United States Patent [19]
Kato et al.

[11] Patent Number: 5,970,507
[45] Date of Patent: Oct. 19, 1999

[54] SEMICONDUCTOR MEMORY DEVICE HAVING A REFRESH-CYCLE PROGRAM CIRCUIT

[75] Inventors: Tetsuo Kato; Kiyohiro Furutani; Hideto Hidaka; Mikio Asakura, all of Tokyo, Japan

[73] Assignee: Mitsubishi Denki Kabushiki Kaisha, Tokyo, Japan

[21] Appl. No.: 08/676,963

[22] Filed: Jul. 8, 1996

[30] Foreign Application Priority Data

Dec. 12, 1995 [JP] Japan .................................. 7-323076

[51] Int. Cl.⁶ ...................................................... G06F 12/00
[52] U.S. Cl. ............................ 711/106; 365/222; 365/201
[58] Field of Search ............................. 365/222, 189.01, 365/201, 230.03, 189.04; 395/403; 711/3, 106

[56] References Cited

U.S. PATENT DOCUMENTS

| | | | |
|---|---|---|---|
| 4,677,592 | 6/1987 | Sakurai et al. | 365/222 |
| 4,823,302 | 4/1989 | Christopher | 711/106 |
| 4,912,678 | 3/1990 | Mashiki | 365/222 |
| 4,933,907 | 6/1990 | Kumanoya et al. | 365/222 |
| 4,934,826 | 6/1990 | Miyatake et al. | 365/222 |
| 5,251,176 | 10/1993 | Komatsu | 365/222 |
| 5,253,211 | 10/1993 | Suzuki | 365/222 |
| 5,295,110 | 3/1994 | Sakakibara | 365/222 |
| 5,299,168 | 3/1994 | Kang | 365/222 |
| 5,321,662 | 6/1994 | Ogawa | 365/222 |
| 5,349,562 | 9/1994 | Tanizaki | 365/222 |
| 5,373,475 | 12/1994 | Nagase | 365/222 |
| 5,608,682 | 3/1997 | Jinbo et al. | 365/222 |
| 5,703,823 | 12/1997 | Douse et al. | 365/222 |

FOREIGN PATENT DOCUMENTS 59-167898  9/1984  Japan.

Primary Examiner—John W. Cabeca
Assistant Examiner—Fred F. Tzeng
Attorney, Agent, or Firm—McDermott, Will & Emery

[57] ABSTRACT

In a semiconductor memory device, a self refresh cycle program circuit is provided and a refresh operation is conducted in accordance with one of the refresh cycles programmed in the refresh-cycle program circuit. The refresh cycle of the self-refresh mode is selected from a plurality of refresh-cycle types. A plurality of refresh modes allows a refresh cycle to be selected from a plurality of refresh-cycle types in accordance with a selected refresh mode.

15 Claims, 20 Drawing Sheets

FIG.9
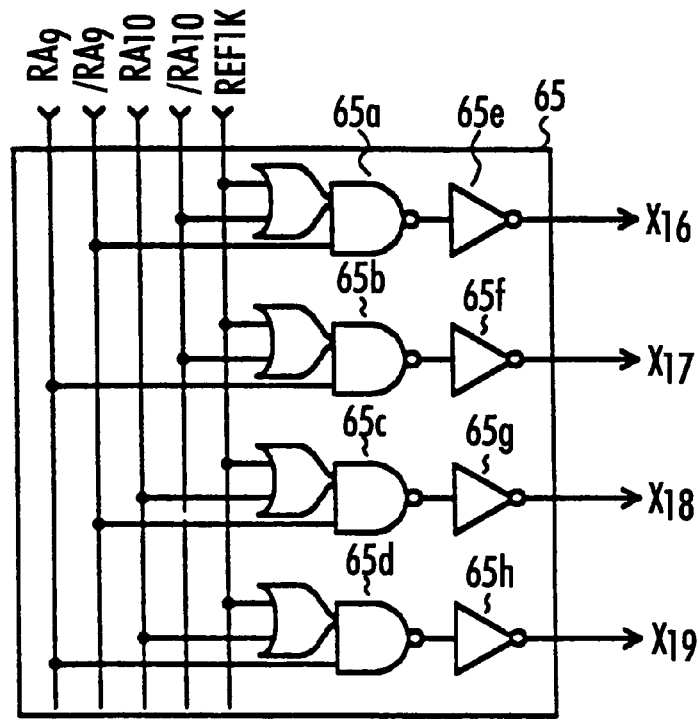
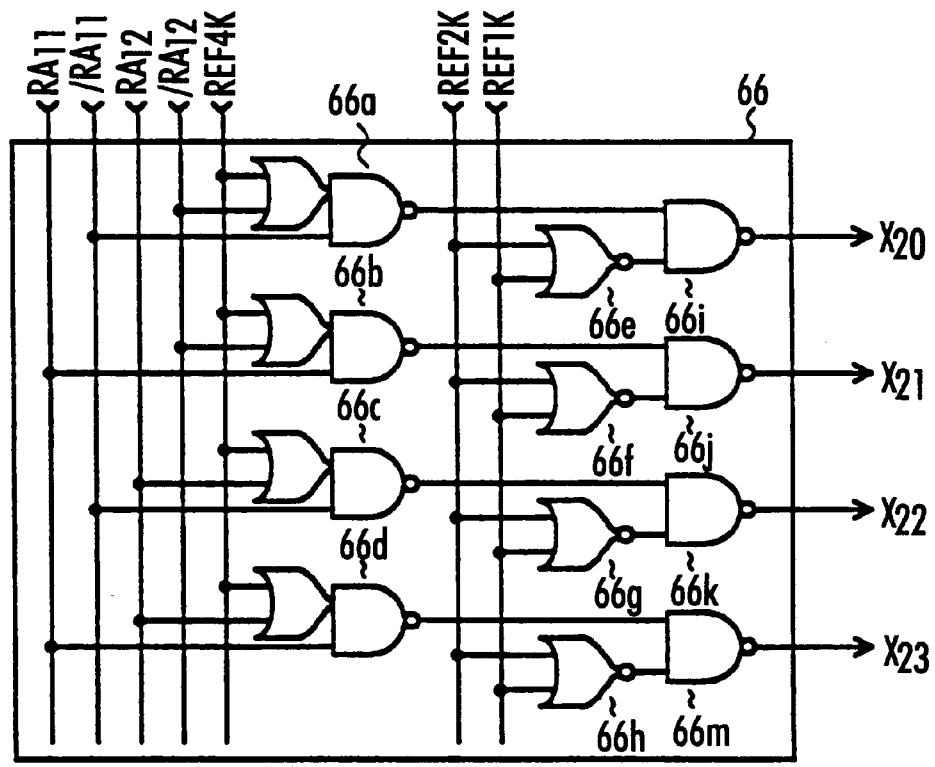

140

NORMAL OPERATION

8K REFRESH OPERATION

4K REFRESH OPERATION

2K REFRESH OPERATION

1K REFRESH OPERATION

FIG. 19
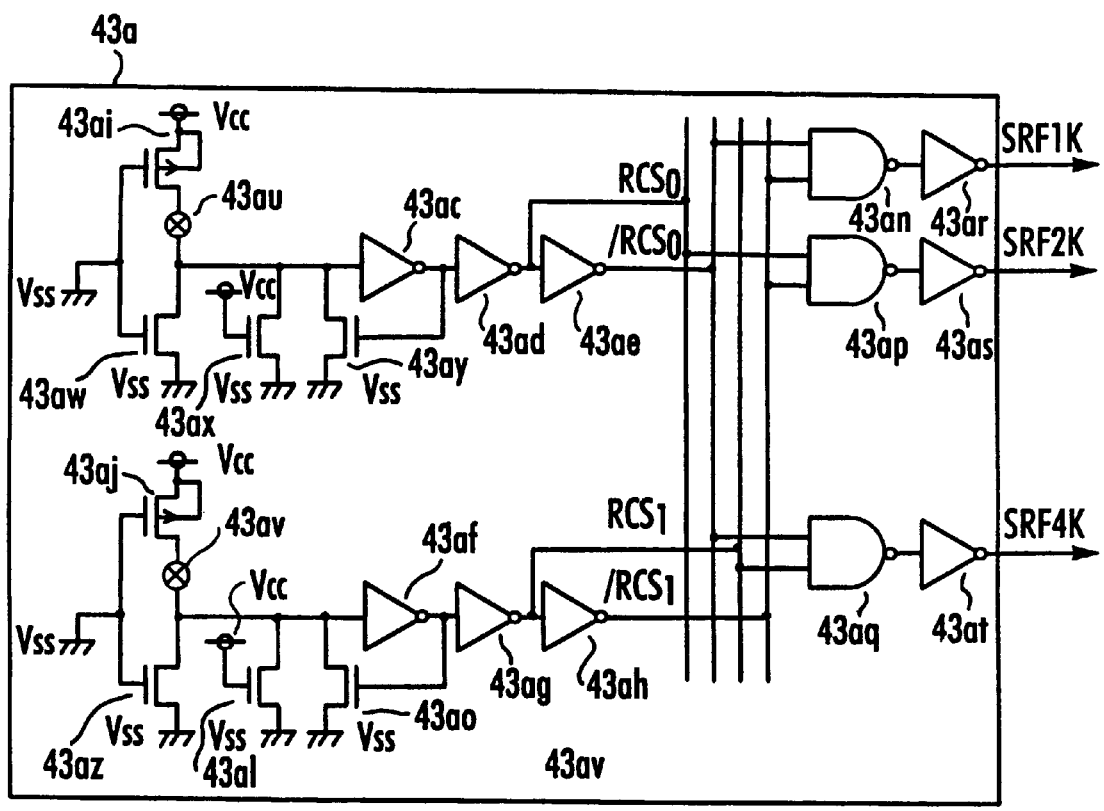
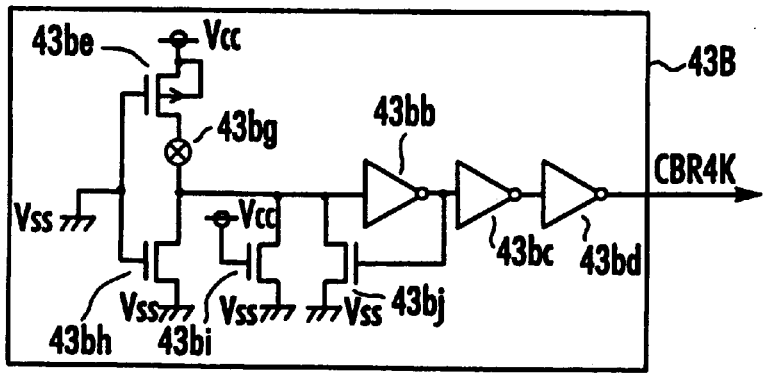

SEMICONDUCTOR MEMORY DEVICE HAVING A REFRESH-CYCLE PROGRAM CIRCUIT

TECHNICAL FIELD

The present invention relates to a semiconductor memory device. In particular, the present invention relates to a DRAM (Dynamic Random Access Memory) which requires refresh operations.

BACKGROUND ART

Personal computers and work stations have as a main memory unit for storing data a DRAM (Dynamic Random Access Memory), onto which data can be recorded and retrieved.

The DRAM comprises a plurality of memory cells, each storing 1 bit of data. Each memory cell further comprises a MOS transistor and a capacitor. Data is stored in a memory cell as a potential appearing at the electrode of the capacitor. Data is stored in a memory cell by providing an H (high) or L (low) level to one of the electrodes of the capacitor through the MOS transistor. By putting the MOS transistor in a non-conductive state, the potential provided to the capacitor is held, and data is allowed to be stored therein. Since the memory cell of a DRAM has few elements, a DRAM with a large capacity can be produced at a relatively low cost.

Although the MOS transistor of the memory cell is put in a non-conductive state in order to sustain a potential in the capacitor, the potential held in the capacitor changes due to a sub-threshold leak current of the MOS transistor, inevitably data stored in the memory cell is lost. For this reason, periodical refresh operations are executed in the DRAM in order to maintain stored data. In this refresh operation, a potential, the polarity of which depends upon data stored in the memory cell, is again provided to the capacitor.

The 16Mbit DRAMs which are mass-produced at the present time have a refresh mode for implementing CBR (column address strobe before row address strobe, or CAS before RAS, or CBR) refresh operations. In this mode, a DRAM is provided with CBR timing with which, after a column-address strobe signal CAS has been lowered to the L level, a row-address strobe signal RAS is lowered. With CBR timing, a refresh address is generated in the DRAM and a refresh operation is carried out at the refresh address. The 16Mbit DRAM has two kinds of refresh cycles: 2K and 4K refresh cycles. Before the chip is put in a package in an assembly operation, a refresh-cycle type is set for the DRAM. That is, a DRAM chip is put in a package and shipped with a refresh-cycle type pre-selected. Thus, an operation to complete refreshing all memory cells in the DRAM with CBR timing applied to the DRAM 2K (2,048) times or 4K (4,096) times is pre-selected.

In Japanese Patent Laid-open No. Sho 59-167898, a DRAM having a mode called self refresh is disclosed. In the self-refresh mode, a refresh operation is automatically carried out when an external /RFSH clock signal provided to the chip is sustained at the L level for a duration of 15 to 16 seconds.

In the conventional DRAM described above, a refresh cycle of the self-refresh mode can not be selected from a plurality of refresh-cycle types. That is, DRAMs having different self-refresh cycles must be fabricated through distinct manufacturing lines with distinct masks, giving rise to a problem that the manufacturing cost is high.

DISCLOSURE OF THE INVENTION

The present invention addresses the problem described above. It is an object of the present invention to provide a semiconductor memory device which allows the refresh cycle of the self-refresh mode to be selected from a plurality of refresh-cycle types.

It is another object of the present invention to provide a semiconductor memory device which has a plurality of refresh modes and allows a refresh cycle to be selected from a plurality of refresh-cycle types in accordance with a selected refresh mode.

One aspect of the invention is a semiconductor memory device in which each of a plurality of memory blocks includes a plurality of memory cells laid out to form a plurality of rows and a plurality of columns, and each of a plurality of word lines is associated with one of the rows and each of a plurality of pairs of bit lines is associated with one of the columns; a plurality of sense amplifiers are connected to the pairs of bit lines; a refresh-cycle program circuit programs refresh cycles; an address generating circuit generates refresh address signals for use in refresh operations; and a self-refresh control circuit increments a value represented by the refresh address signals at fixed-time intervals in self-refresh mode; and select means selects one of the memory blocks in accordance with one of the refresh cycles programmed by the refresh-cycle program circuit, and selects one of the word lines of the selected memory block and activates some of the sense amplifiers associated with the selected memory block.

Another aspect of the invention is a semiconductor memory device as described above and further in that for the select means, a block decoder outputs block select signals for selecting one of the memory blocks in accordance with some of the refresh address signals for selecting blocks and in accordance with the refresh cycle programmed by the refresh-cycle program circuit; a plurality of row decoder blocks each associated with one of the memory blocks wherein each of the row decoder blocks is put in a select state by said block select signal assigned thereto and, in the select state, selects one of the word lines in the memory block associated with the row decoder block in accordance with some of the refresh address signals for selecting the word line.

Another aspect of the invention is a semiconductor memory device as stated above and further in that for the select means, a sense-amplifier enable signal generating circuit activates the sense amplifiers associated with the memory block selected in accordance with some of the refresh address signals for selecting blocks and in accordance with the refresh cycle programmed by the refresh-cycle program circuit.

Another aspect of the invention is a semiconductor memory device in which each of a plurality of memory blocks comprises a plurality of memory cells laid out to form a plurality of rows and a plurality of columns, and each of a plurality of word lines is associated with one of the rows and each of a plurality of pairs of bit lines is associated with one of the columns; a plurality of sense amplifiers is connected to the pairs of bit lines; a first refresh-cycle program circuit programs first refresh cycles in first refresh mode; a second refresh-cycle program circuit programs second refresh cycles in second refresh mode; an address generating circuit generates refresh address signals for use in refresh operations; and select means selects one of the memory blocks in accordance with one of the first refresh cycles programmed by the first refresh-cycle program circuit in the first refresh mode, and selects one of the memory blocks in accordance with one of said second refresh cycles programmed by the second refresh-cycle program circuit in the second refresh mode, and selects some of the word lines of the selected memory blocks and activates some of the sense amplifiers associated with the selected memory block.

Other features and advantages of this invention will become apparent from the following descriptions.

BRIEF DESCRIPTION OF DRAWINGS

FIG. 9 depicts the circuits of the partial decoders of a dynamic random access memory in the first embodiment of the present invention.

FIG. 19 depicts the self-refresh cycle program circuit and the CBR-refresh cycle program circuit employed in the refresh cycle control circuit of a dynamic random access memory in the second embodiment of the present invention.

BEST MODE FOR CARRYING OUT THE INVENTION

Figure 1:
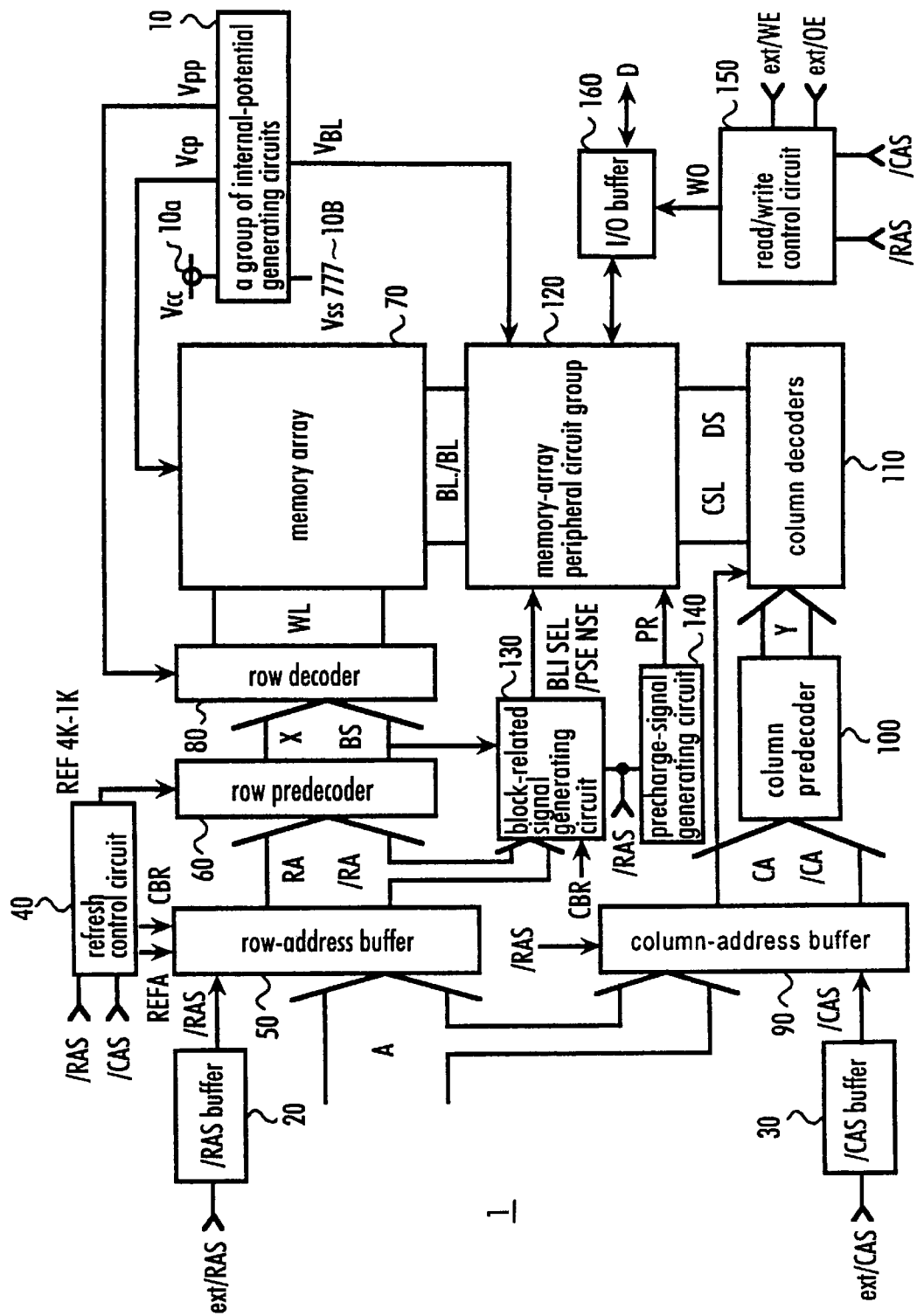
FIG. 1 depicts a block diagram of a dynamic random access memory of the first embodiment of the present invention.

This invention will be described in further detail by way of example with reference to the accompanying drawings.

First Embodiment

A first embodiment of the present invention for implementing a 64Mbit DRAM is depicted in FIGS. 1 to 18. Depicted in FIGS. 1 and 1A, a DRAM 1 is driven by a power supply Vcc with a potential of 3.3V applied to a power-supply-potential node 10a and a ground potential Vss of 0V, the other potential of the power supply applied to a ground-potential node 10b. The DRAM 1 includes a group of internal-potential generating circuits 10 which comprises circuits for generating internal potentials such as a bit line precharge potential generating circuit 10c a cell plate potential generating circuit 10e and an increased voltage potential generating circuit 10d. The bit line precharge potential generating circuit 10c outputs a bit-line precharge potential VBL (=(Vcc+Vss)/2), a middle potential between the power-supply potential Vcc and the ground potential Vss. The cell plate potential generating circuit 10e outputs a cell plate potential Vcp of the bit line precharge potential VBL (=(Vcc+Vss)/2). The increased voltage potential generating circuit 10d outputs an increased potential Vpp of 7V by increasing the power-supply potential Vcc.

In addition, the DRAM 1 also includes a /RAS buffer 20, a /CAS buffer 30 and a refresh control circuit 40. Receiving an external row-address strobe signal ext/RAS provided by an external source, the /RAS buffer 20 outputs a row-address strobe signal /RAS for use in internal circuits. Likewise, receiving an external column-address strobe signal ext/CAS provided by an external source, the /CAS buffer 30 outputs a column-address strobe signal /CAS for use in internal circuits. Receiving the row-address strobe signal /RAS from the /RAS buffer 20 and the column-address strobe signal /CAS from the /CAS buffer 30, the refresh control circuit 40 generates a CBR detecting signal CBR, refresh-address signals REFA0 to REFA12 and refresh-cycle requesting signals REF4K, REF2K and REF1K. The CBR detecting signal CBR turns to the H level to indicate the detection of CBR (/CAS Before /RAS) timing with which the column-address strobe signal /CAS changes from the H level to the L level before the row-address strobe signal /RAS changes from the H level to the L level. The value represented by the refresh-address signals REFA0 to REFA12 is incremented upon the completion of a CBR cycle evidenced by both the column-address strobe and row-address strobe signals /CAS and /RAS changing from the L level to the H level after the detection of the CBR timing. The value represented by the refresh-address signals REFA0 to REFA12 is also automatically incremented every 16 microseconds if the CBR cycle is not ended in 100 microseconds after the CBR timing has been detected. The refresh-cycle requesting signals REF4K, REF2K and REF1K are used for requesting a refresh operation in 4K, 2K and 1K refresh cycles respectively.

Furthermore, the DRAM 1 also has a row-address buffer 50 which receives address signals Ai (where i=0, 1, . . . , 12) provided by an external source, the row-address strobe signal /RAS supplied by the /RAS buffer 20, the refresh-address signals REFAi provided by the refresh control circuit 40 and the CBR detecting signal CBR. With the CBR detecting signal CBR set to the L level to indicate no CBR-timing detection, the row-address buffer 50 selects either the address signals Ai latched as row-address signals or the refresh-address signals REFAi provided by the refresh control circuit 40 as address signals Ai. The row-address buffer 50 then outputs the row-address signals RAi at levels of the same logic as the selected address signals Ai and the row-address signals /RAi at levels of the inverted logic of the selected address signals Ai for use in the internal circuits at the transition of the row-address strobe signal /RAS from the H level to the L level. With the CBR detecting signal CBR set to the H level to indicate a CBR-timing detection, the row-address buffer 50 selects either the address signals Ai or the refresh-address signals REFAi as refresh address signals REFAi, outputting the row-address signals RAi at levels of the same logic as the refresh-address signal REFAi and the row-address signals /RAi at levels of the inverted logic of the refresh-address signal REFAi at the transition of the row-address strobe signal /RAS from the H level to the L level.

The DRAM 1 also has a row predecoder 60. Receiving the row-address signals RAi and /RAi provided by the row-address buffer 50 and the refresh-cycle requesting signals REF4K, REF2K and REF1K supplied by the refresh control circuit 40, the row predecoder 60 generates row predecode signals X0 to X23 and block select signals BSj (where j=0, 1, . . . , 127). Depending upon the row-address signals RA0, /RA0, RA1 and /RA1, one of the row predecode signals X0 to X3 is raised to the H level. Depending upon the row-address signals RA2, /RA2, RA3 and /RA3, one of the row predecode signals X4 to X7 is raised to the H level. Depending upon the row-address signals RA4, /RA4, RA5 and /RA5, one of the row predecode signals X8 to X11 is raised to the H level. Depending upon the row-address signals RA6,/RA6, RA7 and /RA7, one of the row predecode signals X12 to X15 is raised to the H level. When the refresh-cycle requesting signal REF1K is set at the L level, depending upon the row-address selected by the row-address signals RA8 and /RA8 and RA9 and /RA9 are raised to the H level.

Furthermore, the DRAM 1 includes a memory array 70 comprising four sub-memory arrays which each comprise 16M (8K 2K) memory cells arranged to form a plurality of rows and a plurality of columns. Each of the sub-memory arrays is divided into 32 memory blocks each comprising 512K (256 2K) memory cells. Each of the memory blocks comprises a plurality of rows each including 2K (2,048) memory cells. The rows are each connected to one of 256 word lines. The memory blocks each comprise a plurality of columns each including 256 memory cells. The columns are each connected to one of 2K (2,048) pairs of bit lines. Each of the memory blocks is divided into 4 sub-memory blocks which each have 512 pairs of bit lines.

In addition, the DRAM 1 includes a row decoder 80 which is divided into 128 row-decoder blocks each associated with one of the memory blocks. Each of the row-decoder blocks receives the row predecode signals X0 to X15 supplied by the row predecoder 60 and the block select signal Bsj assigned to the row-decoder block. The selected row-decoder block raises the voltage of one of the 256 word lines associated with the selected row-decoder block to the level of the increased potential Vpp. The word line, the voltage of which is raised, is determined by the row predecode signals X0 to X15. The DRAM 1 further includes a column-address buffer 90. Receiving the address signals Ai (where i=0, 1, 10), the column-address strobe signal /CAS from the column-address buffer 30 and the row-address strobe signal /RAS from the row-address buffer 20, the column-address buffer 90 latches the address signals Ai as column-address signals at the transition of the column-address strobe signal /CAS from the H level to the L level if the row-address strobe signal /RAS is set at the L level and then generates column-address signals CAi at levels of the same logic as the address signals Ai and column-address signals /CAi at levels of the inverted logic of the address signals Ai for use in internal circuits.

In addition, the DRAM 1 includes a column predecoder100. Receiving the column-address signals CAi and /CAi provided by the column-address buffer 90, the column predecoder 100 outputs column predecode signals Y0 to Y19. Depending upon the column-address signals CA1, /CA1, CA2 and /CA2, one of the column predecode signals Y0 to Y3 is raised to the H level. Depending upon the column-address signals CA3, /CA3, CA4 and /CA4, one of the column predecode signals Y4 to Y7 is raised to the H level. Depending upon the column-address signals CA5, /CA5, CA6 and /CA6, one of the column predecode signals Y8 to Y11 is raised to the H level. Depending upon the column-address signals CA7,/CA7, CA8 and /CA8, one of the column predecode signals Y12 to Y15 is raised to the H level. Depending upon the column-address signals CA9, /CA9, CA10 and /CA10, one of the column predecode signals Y16 to Y19 is raised to the H level.

The DRAM 1 further includes column decoders 110 which comprise a total of 16 column-decoder blocks each associated with a row of sub-memory blocks in the same sub-memory array. Each of the column-decoder blocks is shared by the 32 sub-memory blocks of the row of sub-memory blocks associated with the column-decoder block. Receiving the column predecode signals YO to Y19 from the column predecoder 100 and the column-address signals CA0 and /CA0 from the column-address buffer 90, each of the column-decoder blocks generates column select signals CSLk (where k=0, 1, , 127) one of which is raised to the H level. The one that is raised to the H level is determined in accordance with the column predecode signals Y0 to Y11 and the column-address signals CA0 and signals RA9, /RA9, RA10 and /RA10, one of the row predecode signals X16 to X19 is raised to the H level. When the refresh-cycle requesting signal REF1K is set at the H level to request the 1K refresh cycle, depending upon the row-address signals RA9 and /RA9, two of the row predecode signals X16 to X19 are raised to the H level. When the refresh-cycle requesting signals REF4K, REF2K and REF1K are all set at the L level, depending upon the row-address signals RA11, /RA11, RA12 and /RA12, one of the row predecode signals X20 to X23 is raised to the H level. When the refresh-cycle requesting signal REF4K is set at the H level to request the 2K refresh cycle, depending upon the row-address signals RA11 and /RA11, two of the row predecode signals X20 to X23 are raised to the H level. When the refresh-cycle requesting signal REF2K is set at the H level to request the 4K refresh cycle or when the refresh-cycle requesting signal REF1K is set at the H level to request the 1K refresh cycle, all the row predecode signals X20 to X23 are raised to the H level. When the refresh-cycle requesting signals REF4K, REF2K and REF1K are all set at the L level to indicate a normal read/write cycle or when an 8K refresh cycle is requested, 4 of the block select signals BSj (where j=0, 1, . . . , 127) selected by the row-address signals RA8 and /RA8 to RA12 and /RA12 are raised to the H level. When the refresh-cycle requesting signal REF4K is set at the H level to request the 4K refresh cycle, 8 of the block select signals BSj selected by the row-address signals RA8 and /RA8 to RA11 and /RA11 are raised to the H level. When the refresh-cycle requesting signal REF2K is set at the H level to request the 2K refresh cycle,16 of the block select signals BSj selected by the row-address signals RA8 and /RA8 to RA10 and /RA10 are raised to the H level. When the refresh-cycle requesting signal REF1Kis set at the H level to request the 1K refresh cycle, 32 of the block select signals BSj /CA0. Based on the column select signals CSLk, 4 pairs of bit lines are selected from each sub-memory block of 4 memory blocks selected by the block select signal BSj. As a result, a total of 64 pairs of bit lines are selected from the whole memory area. The column decoder 110 also outputs data select signals DSm (where m=0, 1, , 63) for selecting 4 bits out of 64 data bits read from the 64 pairs of bit lines selected by the 16 column decoder blocks depending upon the column predecode signals Y12 to Y19.

Figure 13:
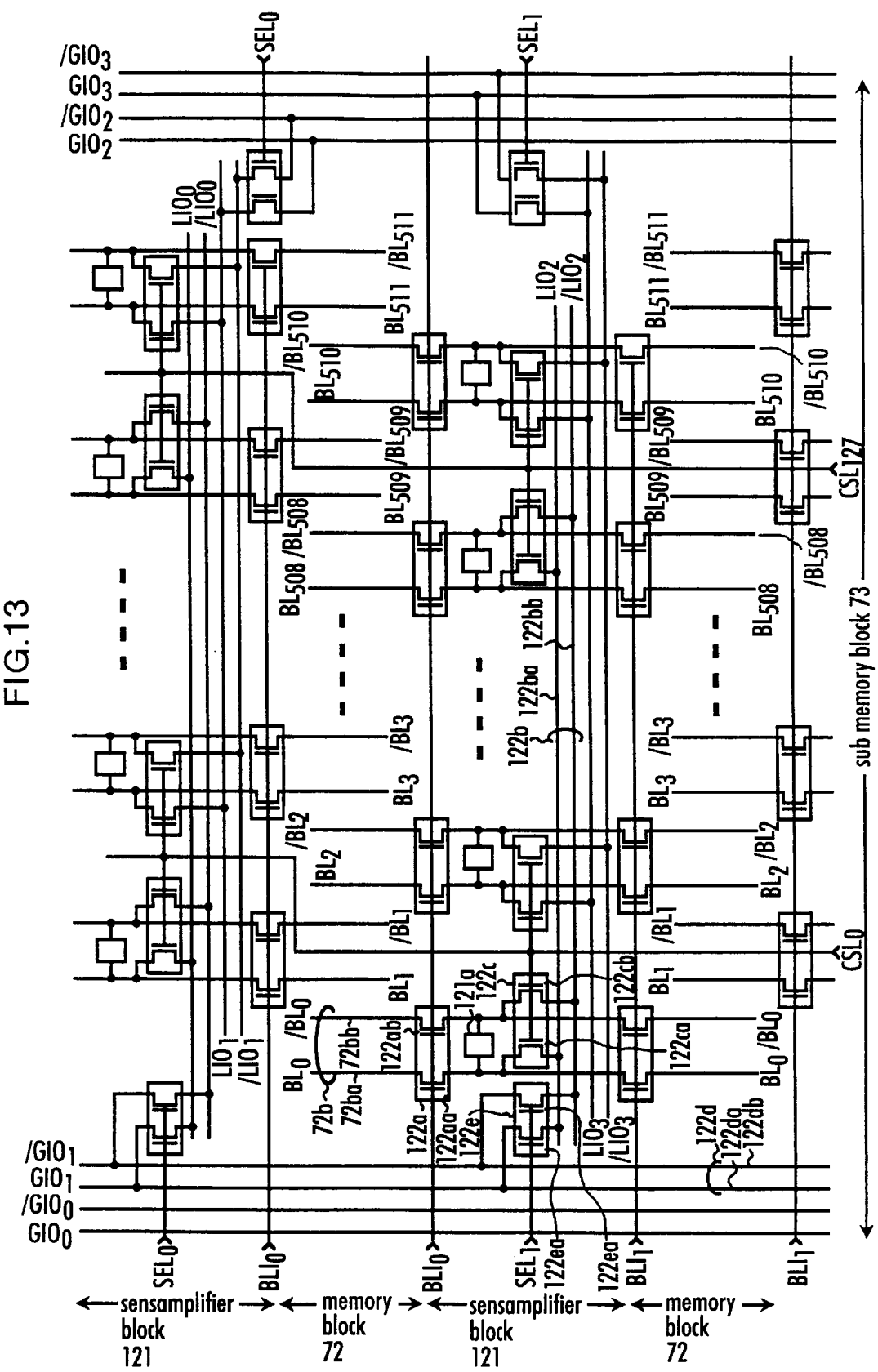
FIG. 13 depicts an overview of the data buses of a dynamic random access memory in the first embodiment of the present invention.

The DRAM 1 also includes a memory-array peripheral circuit group 120, comprising a group of circuits, depicted in FIG. 13, including a plurality of sense amplifiers 121b, local I/O lines 122b and global I/O lines 122d. The sense amplifiers 121b are divided into 132 sense-amplifier blocks 121 corresponding to the memory blocks 72. Each of the sense-amplifier blocks 121 comprises 1K (1,024) sense amplifiers. 124 out of the 132 sense-amplifier blocks are each provided between two adjacent memory blocks 72 and shared by the two memory blocks 72. That is, a memory block 72 is provided between two sense-amplifier blocks 121. The local I/O lines 122b and global I/O lines 122d are used by the memory block 72 to output data of memory cells 72c appearing at bit lines 72b and for forwarding data to be written into memory cells 72c to the bit lines 72b, see FIG. 14.

The DRAM 1 further includes a block-related-signal generating circuit 130 which receives the row-address strobe signal /RAS generated by the /RAS buffer 20, the row-address signals RA8 and /RA8 generated by the address buffer 50, the row predecode signals X16 to X23 generated by the row predecoder 60 and the CBR detecting signal CBR generated by the refresh control circuit 40. When the row-address strobe signal /RAS falls to the L level, the block-related-signal generating circuit 130 outputs bit-line isolating signals BLIn (where n=0, 1, . . . , 127), sense-amplifier enable signals /PSEp and NSEp (where p=0, 1, . . . , 131) and select signals SELp and, when the CBR detecting signal CBR is set at the H level to indicate that the CBR timing has been detected, sets the select signals SELp at the L level to put the local I/O lines 122b and global I/O lines 122d in a disconnected state without regard to the row-address signals RA8 and /RA8 and the row predecode signals X16 to X23. The bit-line isolating signals BLIn are used for isolating bit lines of memory blocks other than a memory block selected by the row-address signals RA8 and /RA8 and the row predecode signals X16 to X23 from the sense amplifiers associated with the deselected memory blocks. The sense-amplifier enable signals /PSEp and NSEp are used for enabling sense amplifiers associated with a selected memory block. The select signals SELp are used for connecting local lines associated with a selected memory block to the global lines in normal read and write operations or when the CBR detecting signal CBR is set at the L level to indicate that the CBR timing has not been detected.

The DRAM 1 further includes a precharge-signal generating circuit 140, a read/write control circuit 150 and an I/O buffer 160. The precharge-signal generating circuit 140 outputs a precharge signal PR for precharging a pair of bit lines. The precharge signal PR is set to the L level when the row-address strobe signal /RAS supplied to the precharge-signal generating circuit 140 is set to the L level. The precharge signal PR is set to the H level when a word line selected by the row decoder 80 is put in a deselected state. Upon receiving the row-address strobe signal /RAS, the column-address strobe signal /CAS, an external write enable signal ext/WE supplied by an external source and an external output enable signal ext/OE also supplied by an external source, the read/write control circuit 150 outputs a read/write control signal WO for indicating a read or write operation. Upon receiving the read/write control signal WO from the read/write control circuit 150, the I/O buffer 160 provides an I/O circuit in the memory-array peripheral circuit group 120 with data corresponding to 4-bit data Dq (where q=, 0, 1, 2, 3) supplied by an external source when the read/write control signal WO indicates a write operation, and provides an external unit with data Dq corresponding to data output by an I/O circuit in the memory array peripheral circuit group 120 when the read/write control signal WO indicates a read operation.

Figure 1A:
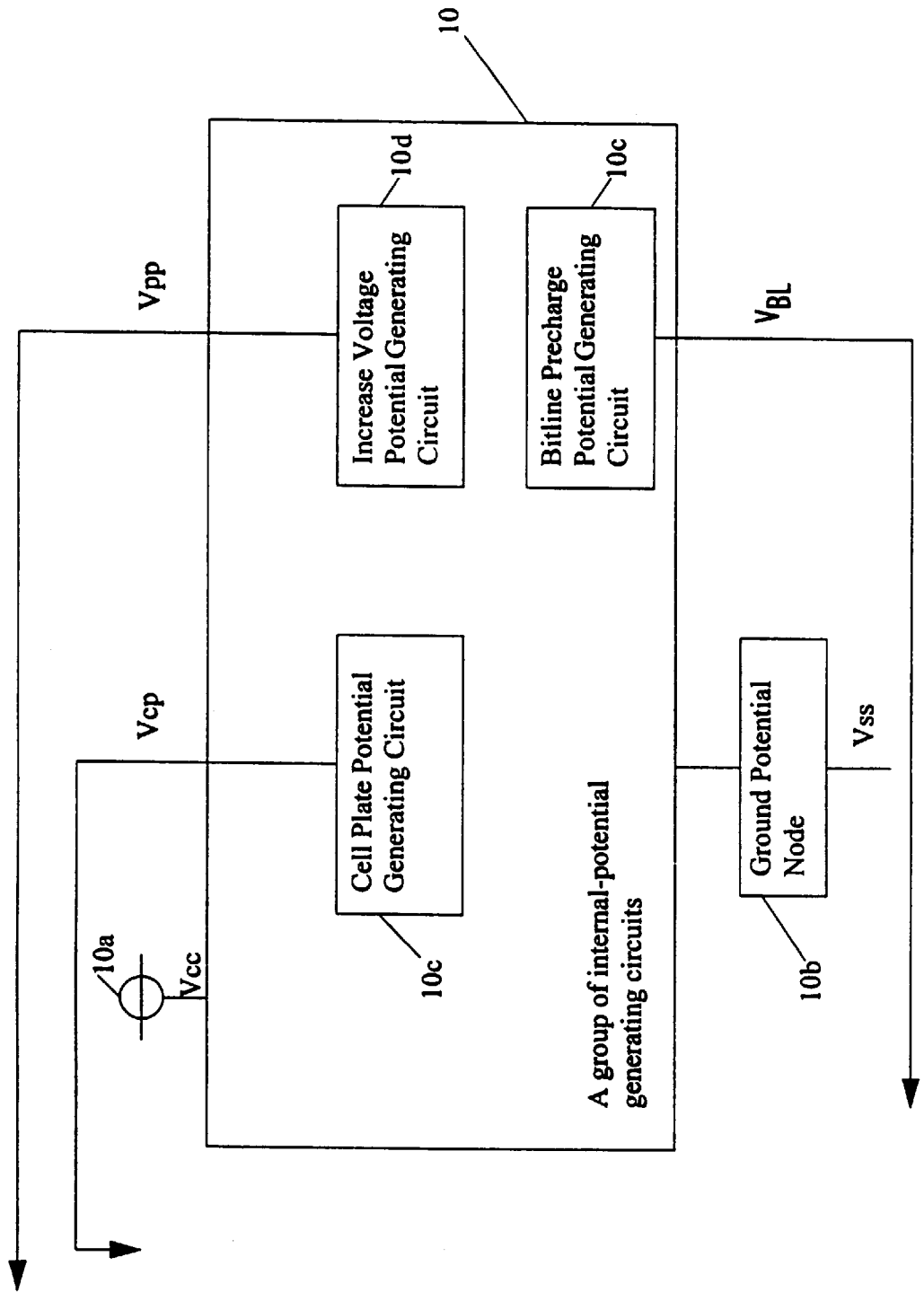
FIG. 1A depicts an expanded block diagram of internal potential generating circuits of a dynamic random access memory of the first embodiment of the present invention.
Figure 2:
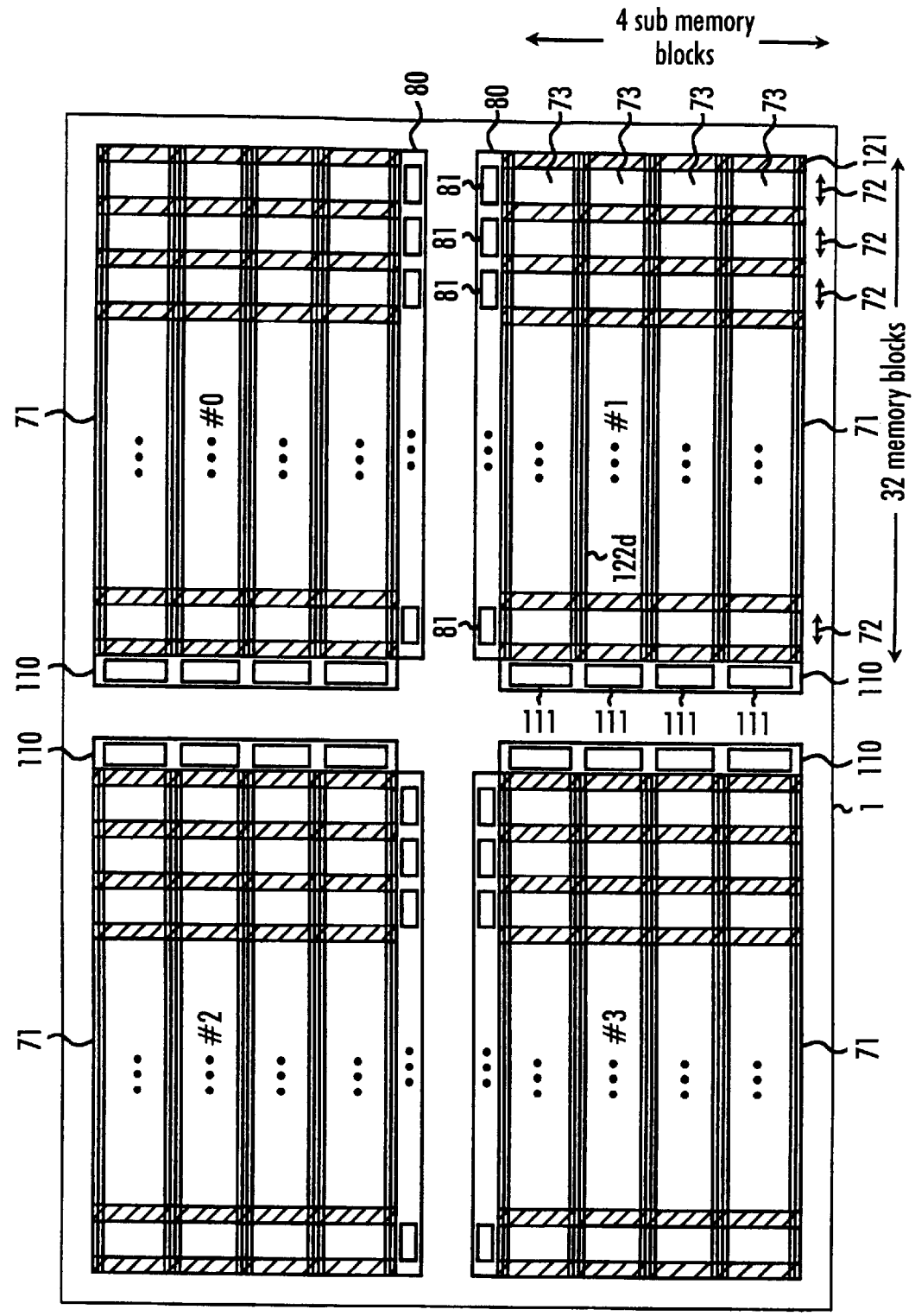
FIG. 2 depicts an overview of a chip of a dynamic random access memory in the first embodiment of the present invention.

FIG. 2 depicts a layout of the memory-cell array 70, the row decoder 80, the column decoder 110 and the memory cell-array peripheral circuit group 120 shown in FIG. 1. As described earlier, the DRAM chip 1 comprises 4 sub-memory arrays 71 which each comprise 32 memory blocks 72 and each of the memory blocks 72 comprises 4 sub-memory blocks 73. In addition, the DRAM chip 1 also includes a row decoder 80 which comprises 128 row decoder blocks each associated with one of the memory blocks 72. Furthermore, the DRAM chip 1 also includes column decoders 110 which each comprise column-decoder blocks 111 each associated with a row of sub-memory blocks 73 in the same sub-memory array 71. Each of the column-decoder blocks 111 is shared by the 32 sub-memory blocks 73 of the row of sub-memory blocks 73 associated with the column-decoder block 111. In addition, the DRAM chip 1 also includes sense-amplifier blocks 121 which sandwich each of the memory blocks 72. The DRAM chip 1 also includes two pairs of global I/O lines 122d provided on each side of the rows of sub-memory blocks 73. That is to say, the pairs of global I/O lines 122d sandwich the rows of sub-memory blocks 73. In FIG. 2, each of the pairs of global I/O lines 122d are shown as a single line.

Figure 3:
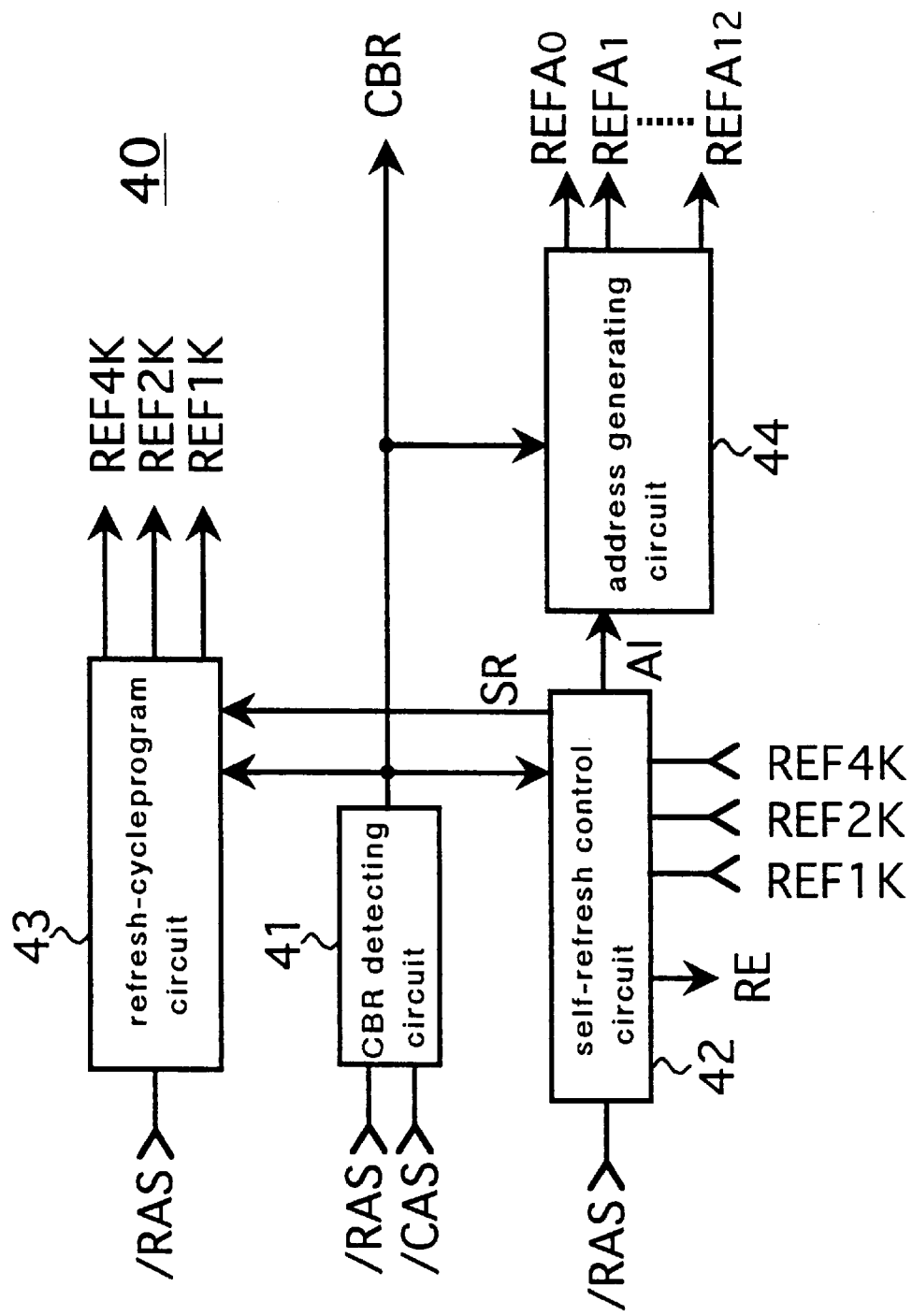
FIG. 3 depicts a refresh control circuit of a dynamic random access memory in the first embodiment of the present invention.

FIG. 3 depicts a refresh control circuit 40 which includes a CBR detecting circuit 41. Receiving the row-address strobe signal /RAS and the column-address strobe signal /CAS, the CBR detecting circuit 41 generates a CBR detecting signal CBR which turns to the H level to indicate the detection of CBR (/CAS Before /RAS) timing with which the column-address strobe signal /CAS changes to the L level before the row-address strobe signal /RAS changes to the L level. As the row-address strobe signal /RAS changes from the L level to the H level, the CBR detecting signal CBR falls from the H level to the L level.

The refresh control circuit 40 also includes a self-refresh control circuit 42. Receiving the CBR detecting signal CBR and the refresh-cycle requesting signals REF4K, REF2K and REF1K, the self-refresh control circuit 42 generates a self-refresh signal SR, an address increment signal AI and a row-address enable signal RE. The self-refresh signal SR changes to the H level when the CBR detecting signal CBR remains at the H level as it is to indicate the detection of CBR timing and 100 microseconds have lapsed since the turning of the CBR detecting signal CBR to the H level. The address increment signal AI changes to the H level at 16 microsecond intervals for a fixed period of time when the CBR detecting signal CBR is set at the H level. The row-address enable signal RE changes to the H level to enable row addresses for a predetermined period of time when the row-address signal /RAS changes to the L level with the CBR detecting signal CBR set at the H level. After the self-refresh signal SR has changed to the H level, the row-address enable signal RE also changes to the H level to enable row addresses for a predetermined period of time at: 16-microsecond intervals when the refresh-cycle requesting signals REF4K, REF2K and REF1K are all set at the L level to request the 8K refresh cycle; 32-microsecond intervals when the refresh-cycle requesting signals REF4K, REF2K and REF1K are set at the H, L and L levels respectively to request the 4K refresh cycle; 64-microsecond intervals when the refresh-cycle requesting signals REF4K, REF2K and REF1K are set at the L, H and L levels respectively to request the 2K refresh cycle; or 128-microsecond intervals when the refresh-cycle requesting signals REF4K, REF2K and REF1K are set at the L, L and H levels respectively to request the 1K refresh cycle.

The refresh control circuit 40 further includes a refresh-cycle program circuit 43 for programming refresh cycles in CBR-refresh and self-refresh modes. The refresh-cycle program circuit 43 receives the CBR detecting signal CBR, the self-refresh signal SR and the row-address strobe signal /RAS. In CBR-refresh mode which is set by putting the CBR detecting signal CBR at the H level and the self-refresh signal SR in the L level, the refresh-cycle program circuit 43 sets the refresh-cycle requesting signals REF4K, REF2K and REF1K at levels in accordance with a refresh cycle programmed for a CBR-refresh operation. Specifically, the refresh-cycle requesting signals REF4K, REF2K and REF1K are all set at the L level to request the 8K refresh cycle or at the H, L and L levels respectively to request the 4K refresh cycle. In self-refresh mode which is set by putting both the CBR detecting signal CBR and the self-refresh signal SR in the H level, on the other hand, the refresh-cycle program circuit 43 sets the refresh-cycle requesting signals REF4K, REF2K and REF1K at levels in accordance with a refresh cycle programmed for a self-refresh operation. To be more specific, the refresh-cycle requesting signals REF4K, REF2K and REF1K are all set at the L level to request the 8K refresh cycle, at the H, L and L levels respectively to request the 4K refresh cycle, at the L, H and L levels respectively to request the 2K refresh cycle or at the L, L and H levels respectively to request the 1K refresh cycle.

Also included in the refresh control circuit 40 is an address generating circuit 44 which receives the CBR detecting signal CBR and the address increment signal AI. Assume that the refresh-address signals REFA0, REFA1, . . . , REFA12 are set at (L, L, L, L, L, L, L, L, L, L, L, L, L) levels and represent the initial address. When the address increment signal AI changes to the H level with the CBR detecting signal CBR set from the H level to the L level, the refresh-address signals REFA0, REFA1, REFA12 are changed to (L, L, L, L, L, L, L, L, L, L, L, L, H) levels to indicate a second address which can be obtained by incrementing the initial address. The refresh-address signals REFA0, REFA1, . . . , REFA12 are then changed to (L, L, L, L, L, L, L, L, L, L, L, H, L) levels to indicate a third address which can be obtained by incrementing the second address. Similarly, the refresh-address signals REFA0, REFA1, . . . , REFA12 are next changed to (L, L, L, L, L, L, L, L, L, L, L, H, H) levels to indicate a fourth address which can be obtained by incrementing the third address.

Figure 4:
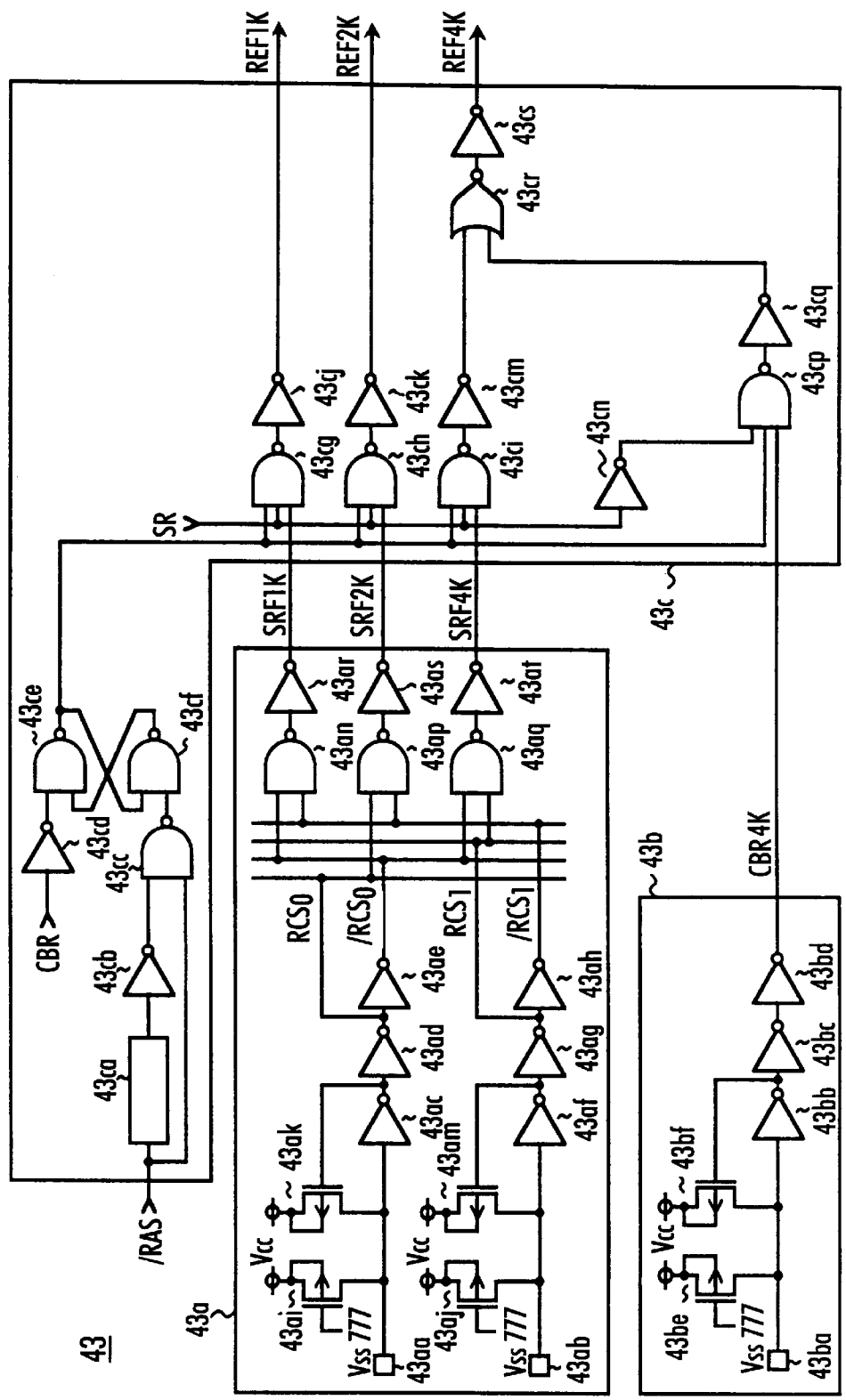
FIG. 4 depicts a refresh-cycle program circuit of the dynamic random access memory in the first embodiment of the present invention.

The refresh-cycle program circuit 43 is shown in FIG. 4. The refresh-cycle program circuit 43 includes a self-refresh-cycle program circuit 43a for setting self-refresh-cycle requesting signals SRF1K, SRF2K and SRF4K at levels in accordance with a refresh cycle programmed for a self-refresh operation. The refresh-cycle program circuit 43 also includes a CBR-refresh-cycle program circuit 43b for setting a CBR-refresh-cycle requesting signal CBR4K at a level in accordance with a refresh cycle programmed for a CBR-refresh operation.

The refresh-cycle program circuit 43 further includes a refresh-cycle switching circuit 43c. Receiving the self-refresh-cycle requesting signals SRF1K, SRF2K and SRF4K, the CBR-refresh-cycle requesting signal CBR4K, the self-refresh signal SR and the CBR detecting signal CBR, the refresh-cycle switching circuit 43c generates the refresh-cycle requesting signals REF4K, REF2K and REF1K in the following manner. With the CBR detecting signal CBR set at the H level, the refresh-cycle switching circuit 43c responds to the self-refresh-cycle requesting signals SRF1K, SRF2K and SRF4K when the self-refresh signal SR is set at the H level to indicate self-refresh mode. When the self-refresh signal SR is set at the L level to indicate CBR-refresh mode, however, the refresh-cycle switching circuit 43c responds to the CBR-refresh-cycle requesting signal CBR4K. With the CBR detecting signal CBR set at the L level, the refresh-cycle switching circuit 43c sets all the refresh-cycle requesting signals REF4K, REF2K and REF1K at the L level without regard to the self-refresh-cycle requesting signals SRF1K, SRF2K and SRF4K and the CBR-refresh-cycle requesting signal CBR4K.

The self-refresh-cycle program circuit 43a comprises pads 43aa and 43ab, inverters 43ac, 43ad, 43ae, 43af, 43ag and 43ah, a p-channel MOS transistor 43ai for pulling up the potential of the pad 43aa, a p-channel MOS transistor 43aj for pulling up the potential of the pad 43ab, a p-channel MOS transistor 43ak constituting a half-latch circuit in conjunction with the inverter 43ac, a p-channel MOS transistor 43am constituting a half-latch circuit in conjunction with the inverter 43af, NAND circuits 43an, 43ap and 43aq and inverters 43ar, 43as and 43at. If the pads 43aa and 43ab are not bonded and left open, the self-refresh-cycle requesting signals SRF1K, SRF2K and SRF4K are all put at the L level. If the pad 43aa is bonded to a ground pad, which is set at the ground potential Vss, with the pad 43ab left open, however, the pulling-up power of the p-channel pull-up MOS transistor 43ai is weak, setting the pad 43aa all but at the ground potential Vss. As a result, the self-refresh-cycle requesting signal SRF4K is programmed at the H level.

Similarly, if the pad 43ab is bonded to the ground pad, with the pad 43aa left open, the pulling-up power of the p-channel pull-up MOS transistor 43aj is weak, setting the pad 43ab all but at the ground potential Vss. As a result, the self-refresh-cycle requesting signal SRF2K is programmed at the H level. If the pads 43aa and 43ab are both bonded to the ground pad, on the other hand, the pads 43aa and 43ab are both set all but at the ground potential Vss. As a result, the self-refresh-cycle requesting signal SRF1K is programmed at the H level.

The self-refresh-cycle program circuit 43b comprises pads 43ba, inverters 43bb, 43bc and 43bd, a p-channel MOS transistor 43be for pulling up the potential of the pad 43ba and a p-channel MOS transistor 43bf constituting a half-latch circuit in conjunction with the inverter 43bb. If the pads 43ba is not bonded and left open, the CBR-refresh-cycle requesting signal CBR4K is put at the L level. If the pad 43ba is bonded to a ground pad, which is set at the ground potential Vss, on the other hand, the pulling-up power of the p-channel pull-up MOS transistor 43be is weak, setting the pad 43ba all but at the ground potential Vss. As a result, the CBR-refresh-cycle requesting signal CBR4K is programmed at the H level.

The refresh-cycle switching circuit 43c comprises a delay circuit 43ca, an inverter 43cb, a NAND circuit 43cc, an inverter 43cd, a NAND circuit 43ce, a NAND circuit 43cf constituting a bridge circuit in conjunction with the NAND circuit 43ce, NAND circuits 43cg, 43ch and 43ci, inverters 43cj, 43ck, 43cm and 43cn, a NAND circuit 43cp, an inverter 43cq, a NOR circuit 43cr and an inverter 43cs. When the CBR detecting signal CBR is put at the L level, a signal output by the NAND circuit 43ce is reset to the L level, setting the refresh-cycle requesting signals REF4K, REF2K and REF1K all at the L level. When the CBR detecting signal CBR is put at the H level, on the other hand, the signal output by the NAND circuit 43ce is set at the H level. In this case, if the self-refresh signal SR is set at the L level, signals output by the NAND circuits 43cg, 43ch and 43ci are all set at the H level, putting the refresh-cycle requesting signals REF2K and REF1K at the L level and the refresh-cycle requesting signals REF4K at a level of the same logic as the CBR-refresh-cycle requesting signal CBR4K.

As described, when the CBR detecting signal CBR is put at the H level, the signal output by the NAND circuit 43ce is set at the H level. In this case, if the self-refresh signal SR is set at the H level, a signal output by the NAND circuit 43cp is set at the H level, putting the refresh-cycle requesting signals REF1K, REF2K and REF4K at levels of the same logic as the self-refresh-cycle requesting signals SRF1K, SRF2K and SRF4K.

Figure 5:
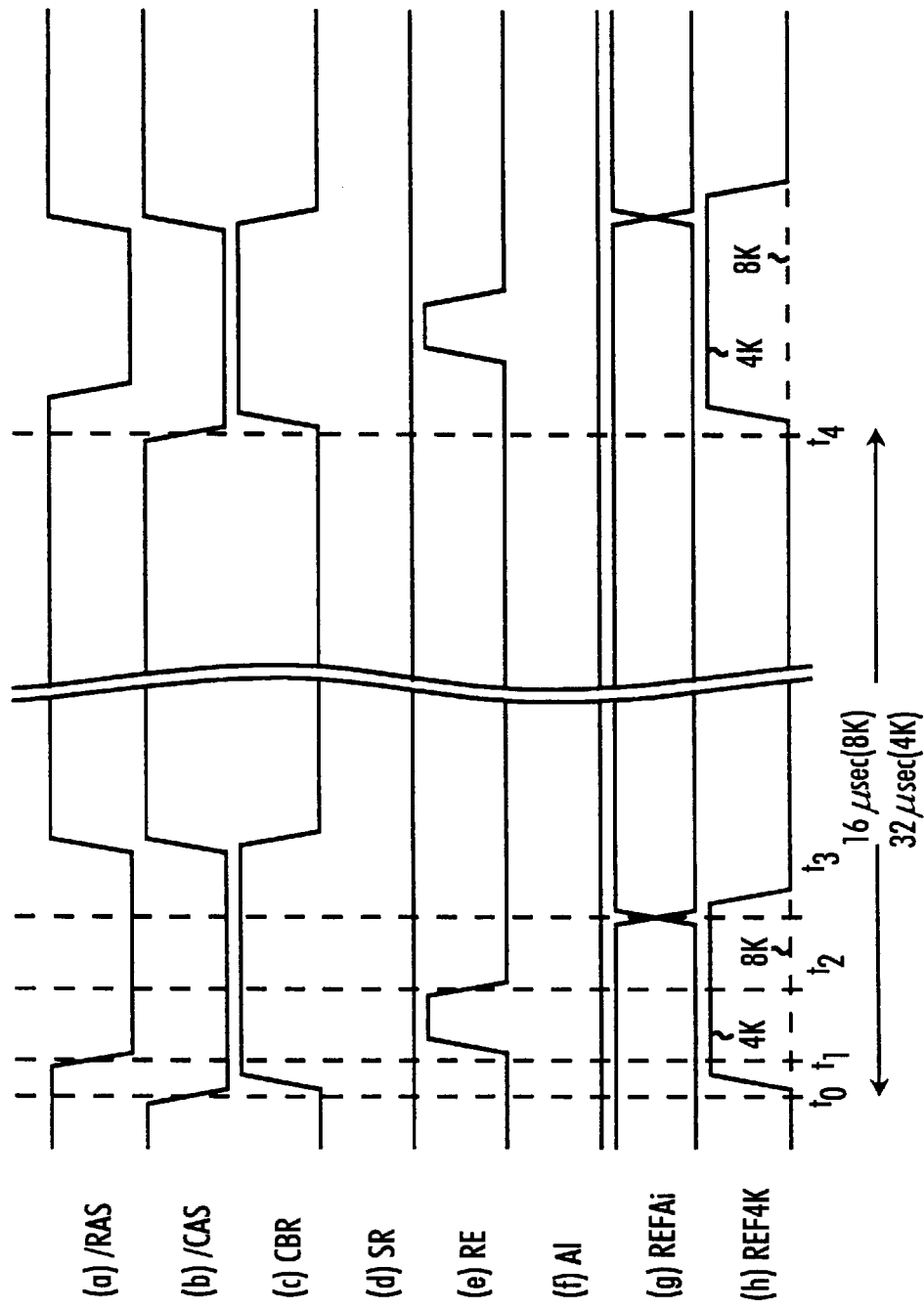
FIG. 5 depicts the timing chart of operations of the refresh control circuit of the dynamic random access memory in the first embodiment of the present invention.

FIG. 5 is the timing charts of operations of the refresh control circuit 40 in CBR-refresh mode. First, when the column-address strobe signal /CAS changes from the H level to the L level at a time t0 with the row-address strobe signal /RAS kept at the H level as shown in FIG. 5(b), the CBR detecting signal CBR changes to the H level accordingly as shown in FIG. 5(c). As the CBR detecting signal CBR changes to the H level, the refresh-cycle requesting signals REF4K changes to the H level, shown in FIG. 5(h), if the 4K refresh cycle is programmed in the refresh-cycle program circuit 43b. If the 8K refresh cycle is programmed in the refresh-cycle program circuit 43b, the refresh-cycle requesting signal REF4K remains at the L level. When the row-address strobe signal /RAS changes to the L level at a time t1 shown in FIG. 5(a), the row-address enable signal RE is set to the H level accordingly for a predetermined period of time, ending at time t2, shown in FIG. 5(e), carrying out a refresh operation.

When the row-address strobe signal /RAS changes from to the H level at a time t3, shown in FIG. 5(a), the CBR detecting signal CBR changes to the L level accordingly, shown in FIG. 5(c). As the CBR detecting signal CBR changes to the L level, the value represented by the refresh-address signals REFAi is incremented, FIG. 5(g). Since the row-address strobe signal /RAS is set to the H level less than 100 microseconds after the CBR detecting signal CBR is set to the H level, the self-refresh signal SR remains at the L level, FIG. 5(d). Responding to the self-refresh signal SR which remains at the L level, the address increment signal AI also remains at the L level, FIG. 5(d).

The DRAM 1 is designed to have a refresh time of 128 msec, and all the memory cells must be refreshed within 128 msec. It is thus necessary to provide CBR timing at 16-microsecond and 32-microsecond intervals for 8K and 4K refresh cycles respectively. Normal read and write operations are carried out between refresh operations.

Figure 6:
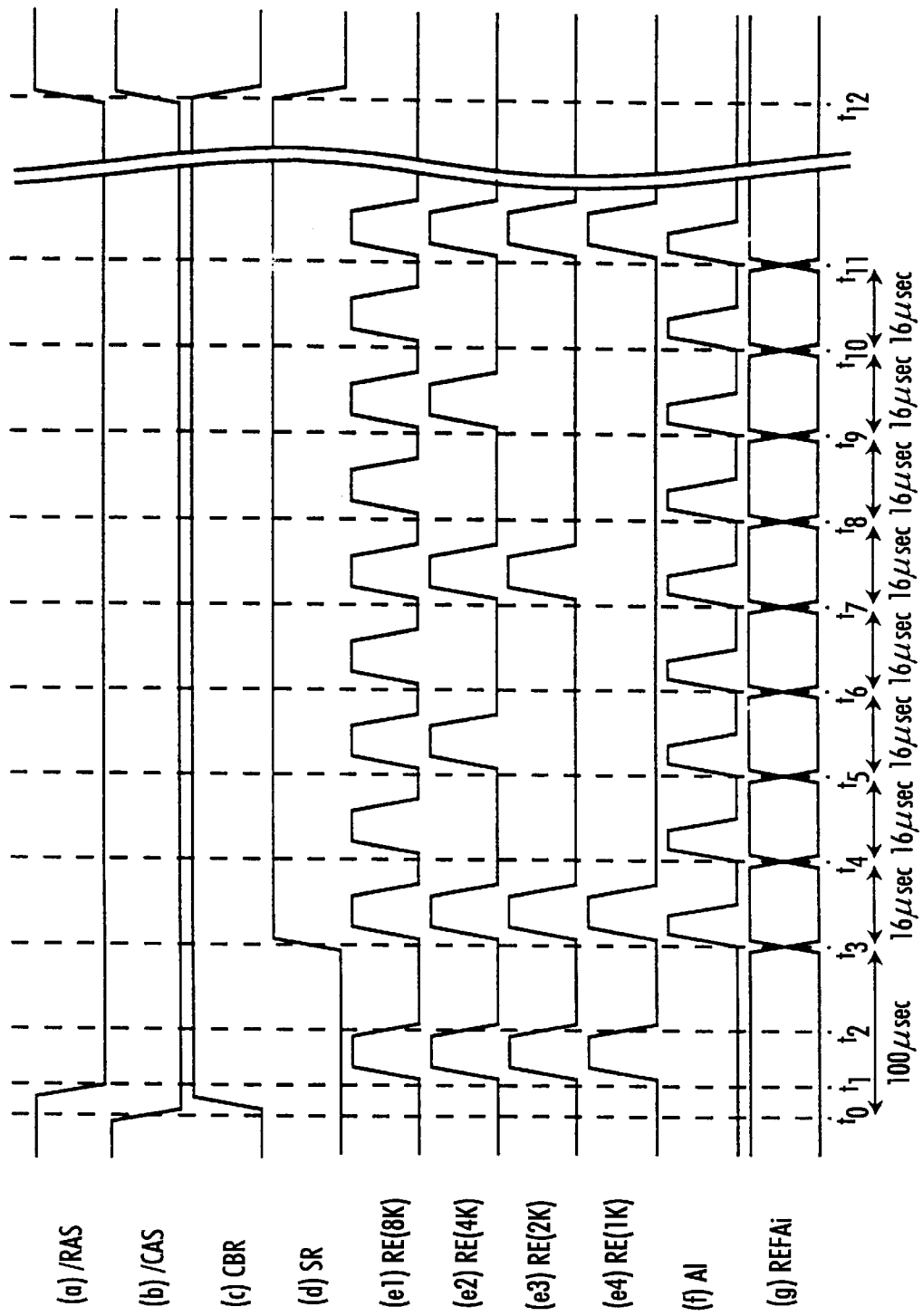
FIG. 6 depicts the timing charts of operations of the refresh control circuit of the dynamic random access memory in the first embodiment of the present invention.

FIG. 6 is the timing charts of operations of the refresh control circuit 40 in self-refresh mode. First, when the column-address strobe signal /CAS changes from the H level to the L level at a time t0 with the row-address strobe signal /RAS kept at the H level, FIG. 6(b), the CBR detecting signal CBR changes to the H level accordingly, FIG. 6(c). When the row-address strobe signal /RAS changes from to the L level at a time t1, FIG. 6(a), the row-address enable signal RE is set to the H level accordingly for a predetermined period of time till a time t2, FIGS. 6(e1) to 6(e4), carrying out a refresh operation.

If the state following the setting of the CBR detecting signal CBR at the H level is sustained for 100 microseconds, the self-refresh signal SR is set to the H level at a time t3, FIG. 6(d). As the self-refresh signal SR is set at the H level, the address increment signal AI is also set at the H level, FIG. 6(f). In response to the setting of the address increment signal AI at the H level, the value represented by the refresh-address signals REFAi is incremented, FIG. 6(g). In addition, as the self-refresh signal SR is set at the H level, the row-address enable signal RE is set to the H level for a predetermined period of time, FIGS. 6(e1) to 6(e4).

Later on, at a time t12 at which the refresh-address signal SR changes to the L level, the address increment signal AI is set to the H level at 16-microsecond intervals, FIG. 6(f). In response to the setting of the address increment signal AI at the H level, the value represented by the refresh-address signals REFAi is incremented, FIG. 6(g). Additionally, in the case of the 8K self-refresh cycle, the row-address enable signal RE is set to the H level for a predetermined period of time at intervals of 16 microseconds, FIG. 6(e1). In the case of the 4K self-refresh cycle, the row-address enable signal RE is set to the H level for a predetermined period of time at intervals of 32 microseconds, FIG. 6(e2). In the case of the 2K self-refresh cycle, the row-address enable signal RE is set to the H level for a predetermined period of time at intervals of 64 microseconds, FIG. 6(e3). In the case of the 1K self-refresh cycle, the row-address enable signal RE is set to the H level for a predetermined period of time at intervals of 128 microseconds, FIG. 6(e4).

When the row-address strobe signal /RAS is set to the H level at the time t12, FIG. 6(a), the CBR detecting signal changes to the L level accordingly, FIG. 6(c). In accordance with this change, the value represented by the refresh-address signals REFAi is incremented, FIG. 6(g). In response to the change of the row-address strobe signal /RAS to the H level, the self-refresh signal SR is set to the L level, FIG. 6(d).

In this way, in the case of the 8K self-refresh cycle, a refresh operation is carried out at an address specified by the refresh-address signals REFAi each time the value represented by the refresh-address signals REFAi is incremented. In the case of the 4K self-refresh cycle, for example, a refresh operation for an address specified by the value of the refresh-address signals REFAi incremented at a time t3 and a refresh operation for an address specified by the value of the refresh-address signals REFAi incremented at a time t4 are carried out at the same time. As a result, a refresh operation is carried out for each two operations to increment the value of the refresh-address signals REFAi. Similarly, in the case of the 2K self-refresh cycle, a refresh operation is carried out for each four operations to increment the value of the refresh-address signals REFAi whereas, in the case of the 1K self-refresh cycle, a refresh operation is carried out for each eight operations to increment the value of the refresh-address signals REFAi.

Figure 7:
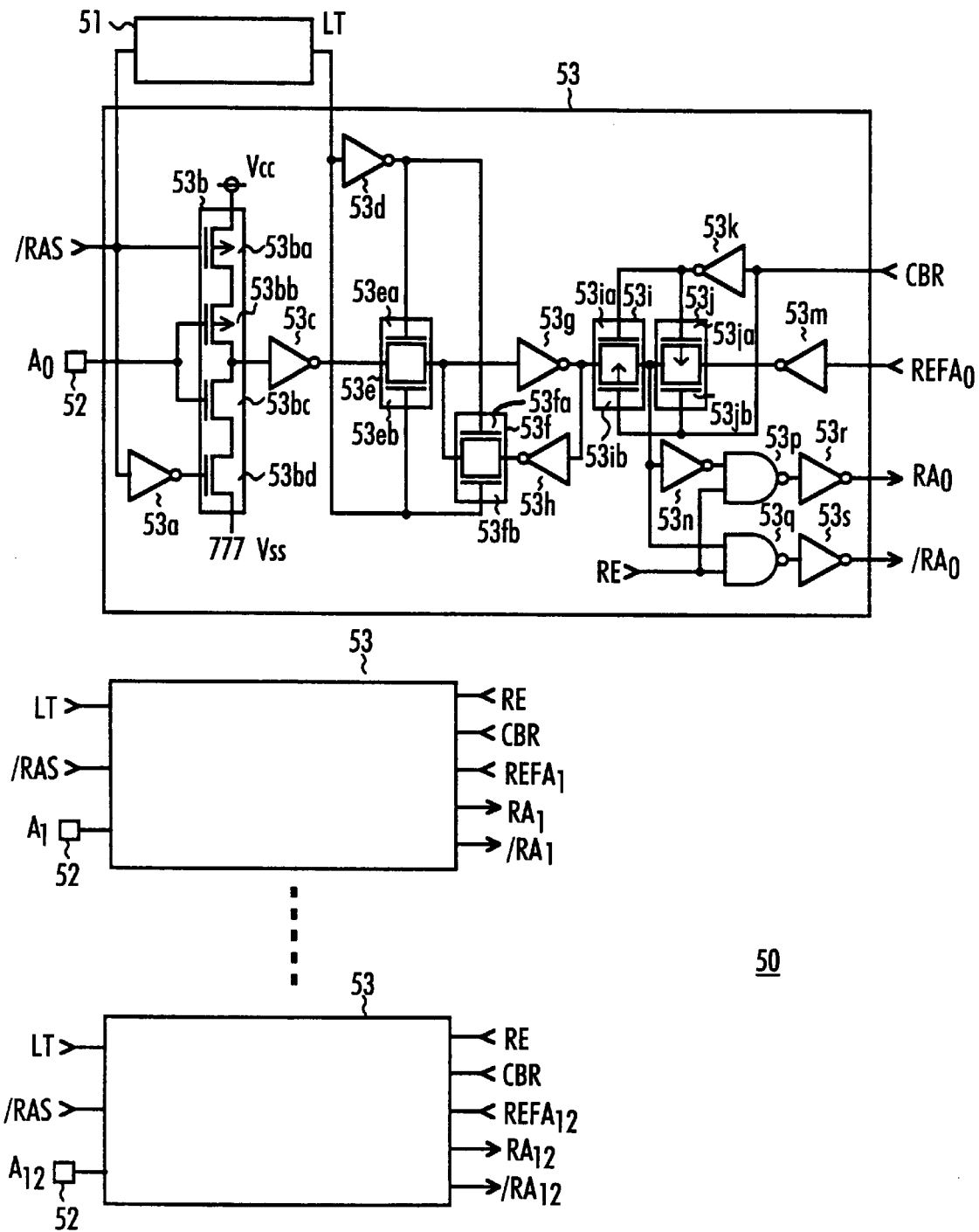
FIG. 7 depicts a circuit diagram of the row-address buffer of the dynamic random access memory in the first embodiment of the present invention.

The row-address buffer 50, shown in FIG. 7, comprises a latch control circuit 51 for generating a latch signal LT for latching address signals A0, A1, A12 with timing determined by the column-address strobe signal /RAS, and a plurality of address pads 52 for receiving the address signals A0, A1, . . . , A12. The row-address buffer 50 also includes row-address outputting circuits 53 which are each associated with one of the address pads 52. The row-address outputting circuits 53 each latch an address signal Ai as requested by the latch signal LT generated by the latch control circuit 51. When the row-address enable signal RE is set at the L level, the row-address signals RAi and /RAi are all set at the L level. With the row-address enable signal RE set at the H level, however, either the row-address signals RAi or /RAi are set at the H level in response to the address signals Ai, if the CBR detecting signal CBR is set at the L level. If the CBR detecting signal CBR is set at the H level with the row-address enable signal RE set at the H level, on the other hand, either the row-address signals RAi or /RAi are set at the H level in response to the refresh-address signals REFAi.

The row-address outputting circuit 53 comprises an inverter 53a, a clocked inverter 53b comprising p-channel MOS transistors 53ba and 53bb and n-channel MOS transistors 53bc and 53bd, inverters 53c and 53d, a transfer gate 53e comprising an n-channel MOS transistor 53ea and a p-channel MOS transistor 53eb, a transfer gate 53f comprising a p-channel MOS transistor 53fa and an n-channel MOS transistor 53fb, an inverter 53g, an inverter 53h which forms a latch circuit in conjunction the inverter 53g when the transfer gate 53f enters a conductive state, a transfer gate 53i comprising an n-channel MOS transistor 53ia and a p-channel MOS transistor 53ib, a transfer gate 53j comprising a p-channel MOS transistor 53ja and an n-channel MOS transistor 53jb, inverters 53k, 53m and 53n, NAND circuits 53p and 53q, and inverters 53r and 53s.

When the row-address strobe signal /RAS is set at the H level in a stand-by state, the p-channel MOS transistor 53ba and the n-channel MOS transistor 53bd employed in the clocked inverter 53b are both put in a non-conductive state, making it impossible for the row-address outputting circuit 53 to input the address signals Ai. As the row-address strobe signal /RAS changes to the L level, the address signals Ai are input and reach the inverter 53g. Later on, the latch signal LT generated by the latch control circuit 51 is changed to the H level, causing the transfer gate 53e to enter a non-conductive state and the transfer gate 53f to enter a conductive state. As a result, the input address signals Ai are latched. When the CBR detecting signal CBR is set at the L level, the transfer gate 53i enters a conductive state while the transfer gate 53j enters a non-conductive state. In these states, as the row-address strobe signal /RAS changes to the L level with the row-address enable signal RE set at the H level, either the row-address signals RAi or /RAi are changed to the H level in response to the latched address signals Ai. When the CBR detecting signal CBR is set at the H level, on the other hand, the transfer gate 53i enters a non-conductive state while the transfer gate 53j enters a conductive state. In these states, as the row-address strobe signal /RAS changes to the L level with the row-address enable signal RE set at the H level, either the row-address signals RAi or /RAi are changed to the H level in response to the refresh-address signals REFAi.

Figure 8:
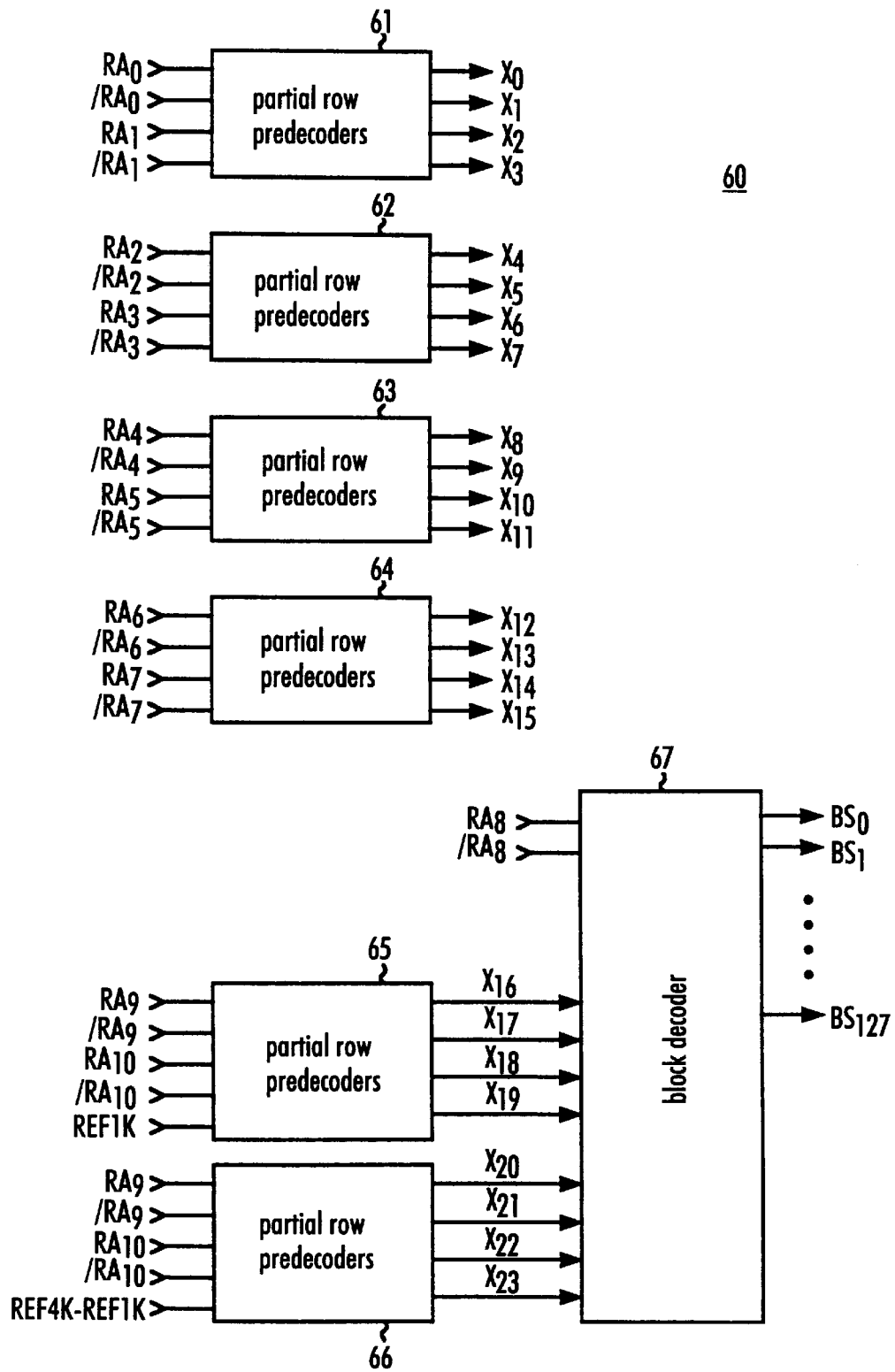
FIG. 8 depicts a block diagram of a row predecoder of a dynamic random access memory in the first embodiment of the present invention.

The row predecoder 60, shown in FIG. 8, comprises partial row predecoders 61, 62, 63 and 64. The partial row predecoder 61 generates the row predecode signals X0 to X3, one of which is set to the H level depending upon the row-address signals RA0, /RA0, RA1 and /RA1. The partial row predecoder 62 generates the row predecode signals X4 to X7, one of which is set to the H level depending upon the row-address signals RA2, /RA2, RA3 and /RA3. The partial row predecoder 63 generates the row predecode signals X8 to X11, one of which is set to the H level depending upon the row-address signals RA4, /RA4, RA5 and /RA5. The partial row predecoder 64 generates the row predecode signals X12 to X15, one of which is set to the H level depending upon the row-address signals RA6, /RA6, RA7 and /RA7.

The row predecoder 60 also includes partial row predecoders 65 and 66. When the refresh-cycle requesting signal REF1K is set at the L level, the partial row predecoder 65 generates row predecode signals X16 to X19, one of which is set to the H level depending upon the row-address signals RA9, /RA9, RA10 and /RA10. When the refresh-cycle requesting signal REF1K is set at the H level to request the 1K refresh operation, on the other hand, the partial row predecoder 65 generates the row predecode signals X16 to X19, two of which are set to the H level depending upon the row-address signals RA9 and /RA9. When the refresh-cycle requesting signals REF4K, REF2K and REF1K are all set at the L level, the partial row predecoder 66 generates row predecode signals X20 to X23, one of which is set to the H level depending upon the row-address signals RA11, /RA11, RA12 and /RA12. When the refresh-cycle requesting signal REF4K is set at the H level to request the 4K refresh operation, the partial row predecoder 66 generates the row predecode signals X20 to X23, two of which are set to the H level depending upon the row-address signals RA11 and /RA11. When the refresh-cycle requesting signal REF2K is set at the H level to request the 2K refresh operation, or when the refresh-cycle requesting signal REF1K is set at the H level to request the 1K refresh operation, the partial row predecoder 66 generates the row predecode signals X20 to X23, which are all set to the H level.

Furthermore, the row predecoder 60 also includes a block decoder 67. Receiving the row-address signals RA8 and /RA8, the row predecode signals X16 to X19 supplied by the partial predecoder 65 and the row predecode signals X20 to X23 fed by the partial predecoder 66, the block decoder 67 generates block select signals BSj. When the refresh-cycle requesting signals REF4K, REF2K and REF1K are all set at the L level to indicate a normal read/write cycle or when an 8K refresh cycle is requested, 4 of the block select signals BSj selected by the row-address signals RA8 and /RA8 to RA12 and /RA12 are raised to the H level. When the refresh-cycle requesting signal REF4K is set at the H level to indicate the 4K refresh cycle, 8 of the block select signals BSj selected by the row-address signals RA8 and /RA8 to RA11 and /RA11 are raised to the H level. When the refresh-cycle requesting signal REF2K is set at the H level to indicate the 2K refresh cycle, 16 of the block select signals BSj selected by the row-address signals RA8 and /RA8 to RA10 and /RA10 are raised to the H level. When the refresh-cycle requesting signal REF1K is set at the H level to indicate the 1K refresh cycle, 32 of the block select signals BSj selected by the row-address signals RA8 and /RA8 and RA9 and /RA9 are raised to the H level.

FIG. 9 depicts circuits of the partial decoders 65 and 66, comprising composite gate circuits 65a, 65b, 65c and 65d, each of which comprise an OR gate and a NAND gate, and inverters 65e, 65f, 65g and 65h. The partial decoder 66 comprises composite gate circuits 66a, 66b, 66c and 66d, each comprising an OR gate and a NAND gate, NOR circuits 66e, 66f, 66g and 66h and NAND circuits 66i, 66j, 66k and 66m.

When the refresh-cycle requesting signal REF1K is set to the H level, the row predecode signals X16 and X18 are set at a level of the same logic as the row-address signal /RA9 while the row predecode signals X17 and X19 are set at a level of the same logic as the row-address signal RA9. That is, the two row predecode signals X16 and X18 or X17 and X19 are set at the H level. At that time, signals output by the NOR circuits 66e, 66f, 66g and 66h are all set at the L level and NAND circuits 66i, 66j, 66k and 66m receiving the signals output by the NOR circuits 66e, 66f, 66g and 66h respectively are all set to the H level. In addition, when the refresh-cycle requesting signal REF2K is set to the H level, one of the row predecode signals X16 to X19 is set to the H level. Also at that time, signals output by the NOR circuits 66e, 66f, 66g and 66h are all set at the L level and NAND circuits 66i, 66j, 66k and 66m receiving the signals output by the NOR circuits 66e, 66f, 66g and 66h respectively are all set to the H level.

Furthermore, when the refresh-cycle requesting signal REF4K is set to the H level, one of the row predecode signals X16 to X19 is set to the H level. At the same time, the row predecode signals X20 and X22 are set at a level of the same logic as the row-address signal /RA11 while the row predecode signals X21 and X23 are set at a level of the same logic as the row-address signal RA11. That is to say, the two row predecode signals X20 and X22 or X21 and X23 are set at the H level. In addition, when the refresh-cycle requesting signals REF4K, REF2K and REF1K are set to the L level, one of the row predecode signals X16 to X19 and one of the row predecode signals X20 to X23 are set to the H level.

Figure 10:
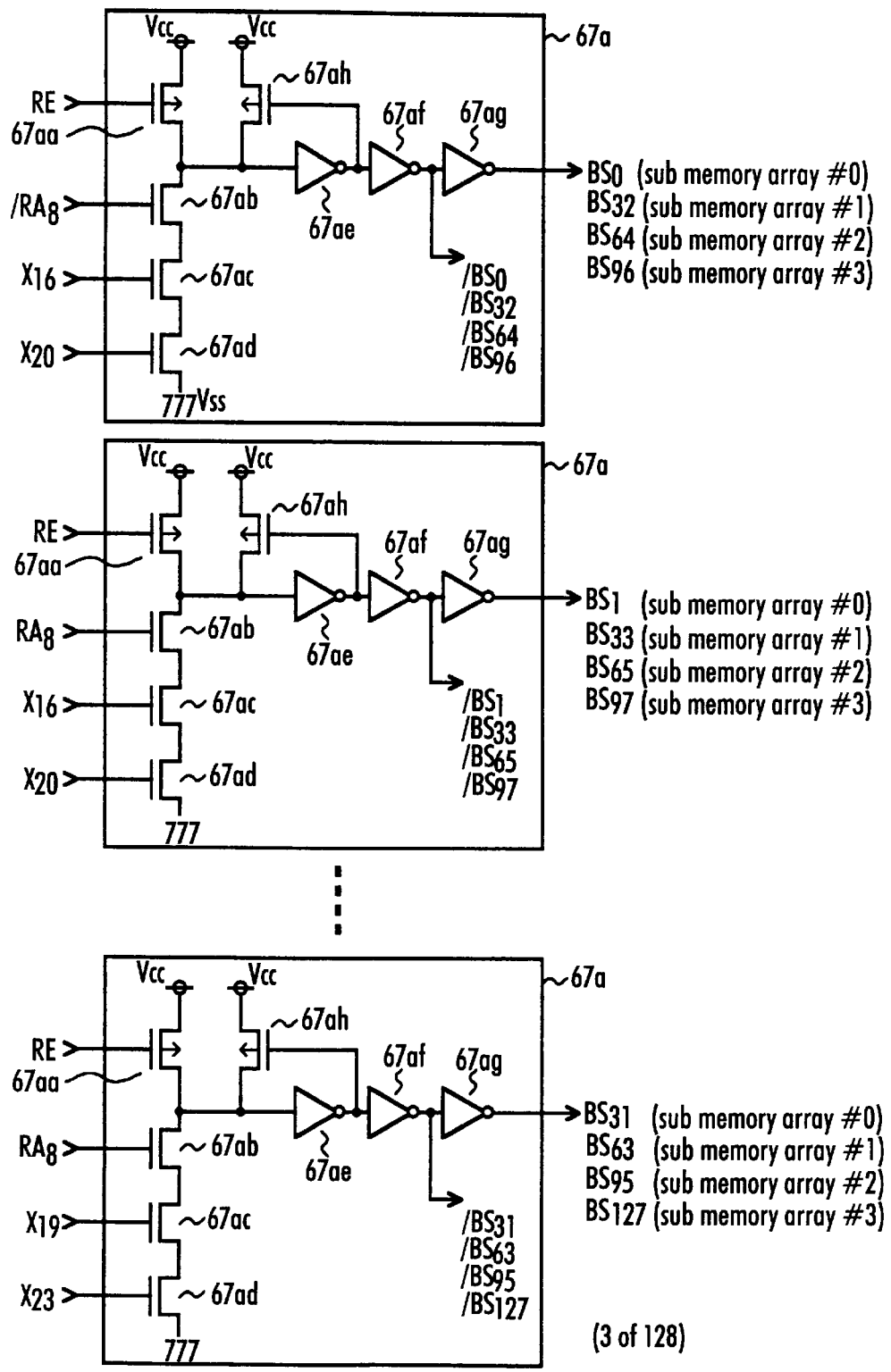
FIG. 10 depicts the circuit of the block decoder of a row predecoder of a dynamic random access memory in the first embodiment of the present invention.

FIG. 10 depicts the circuit of the block decoder 67, which comprises 128 partial decoders 67a each associated with one of the memory blocks 72. All the 128 partial block decoders 67a have the same configuration. Every 4 of the partial block decoders 67a, of which 4 partial block decoders 67a receive the same set of input signals, are assigned to the 4 sub-memory arrays 72 on a one-to-one basis. For example, the 4 partial decoders 67a which generate block select signals BS0, BS32, BS64 and BS96 to be supplied respectively to the sub-memory arrays #0, #1, #2 and #3 denoted by reference numeral 72 receive the same set of input signals and, of course, have the same configuration.

The partial decoders 67a each comprise a p-channel MOS transistor 67aa for receiving the row-address enable signal RE at the gate thereof, an n-channel MOS transistor 67ab for receiving the row-address signal RA8 or /RA8 at the gate thereof, an n-channel MOS transistor 67ac for receiving one of the row predecode signals X16 to X19, an n-channel MOS transistor 67ad for receiving one of the row predecode signals X20 to X23, inverters 67ae, 67af and 67ag and a p-channel MOS transistor 67ah constituting a half-latch circuit in conjunction with the inverter 67ae. When the row-address enable signal RE is set to the H level following a change of the row-address strobe signal /RAS to the L level, the p-channel MOS transistor 67aa enters a non-conductive state. In this case, the partial block decoders 67a, the n-channel MOS transistors 67ab, 67ac and 67ad of which are all put in a conductive state, change the block select signal BSj generated thereby to the H level.

Figure 11:
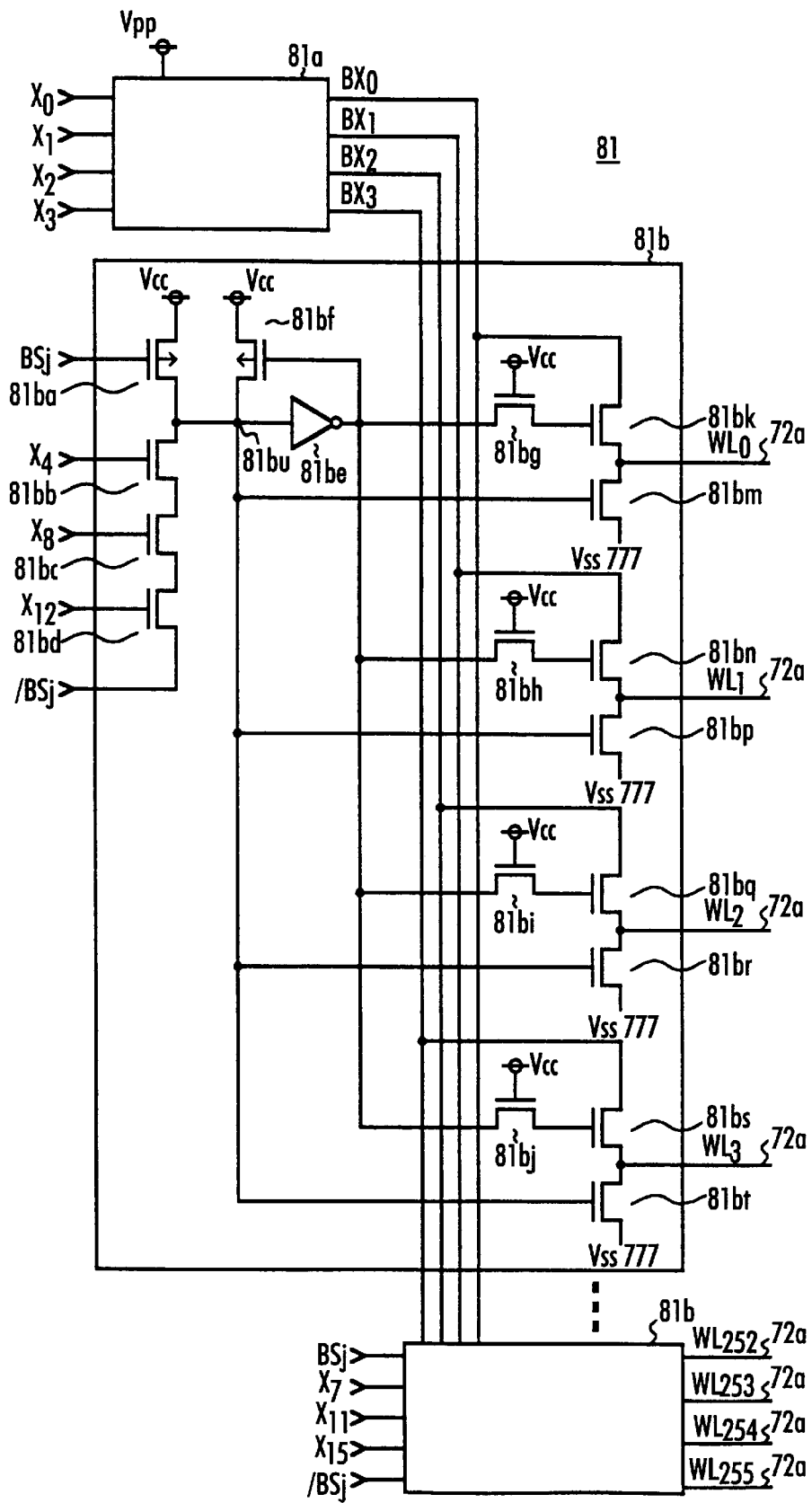
FIG. 11 depicts the circuit of the row decoder block of a dynamic random access memory in the first embodiment of the present invention.

A row decoder block 81 is shown in FIG. 11, comprising an increased-voltage decode-signal generating circuit 81a and 64 partial row decoders 81b. The increased-voltage decode-signal generating circuit 81a converts the row predecode signals X0 to X3 having an amplitude of Vcc-Vss into boosted row predecode signals BX0 to BX3 with an amplitude of Vpp-Vss and outputs the boosted row predecode signals BX0 to BX3. As shown in FIG. 11, the partial row decoders 81b each select 4 of 256 word lines 72a of the memory block associated with the row decoder block 81. Each of the partial row decoders 81b comprises a p-channel MOS transistor 81ba for receiving the block select signal BSj associated with the memory block at the gate thereof, an n-channel MOS transistor 81bb for receiving one of the row predecode signals X4 to X7 at the gate thereof, an n-channel MOS transistor 81bc for receiving one of the row predecode signals X8 to X11 at the gate thereof and an n-channel MOS transistor 81bd for receiving one of the row predecode signals X12 to X15 at the gate thereof and the block select signal BSj at either the source or drain thereof.

The partial row decoder 81b further includes an inverter 81be, a p-channel MOS transistor 81bf forming a half-latch circuit in conjunction with the inverter 81be, n-channel MOS transistors 81bg, 81bh, 81bi and 81bj for receiving the power-supply potential Vcc at the gates thereof and n-channel MOS transistors 81bk, 81bm, 81bn, 81bp, 81bq, 81br, 81bs and 81bt. When the block select signals BSj and /BSj assigned to the memory block associated with the row decoder block 81 are set to the H and L levels respectively to select the associated memory block, the p-channel MOS transistor 81ba enters a non-conductive state and, in one of the 64 partial row decoders 81b, the n-channel MOS transistors 81bb, 81bc and 81bd are all put in a conductive state. The potential of a node 81bu is set at the L level, raising a signal output by the inverter be to the H level. As for the remaining 63 partial row decoders 81b, at least one of the n-channel MOS transistors 81bb, 81bc and 81bd are set in a non-conductive state, causing the potential of the node 81bu in each of the remaining 63 partial row decoders 81b to be sustained at the H level as it is by the half-latch circuit comprising the p-channel MOS transistor 81bf and the inverter 81be. In this state, the inverter 81be in each of the remaining 63 partial row decoders 81b sets an output signal thereof to the L level.

Furthermore, in the partial row decoder 81b in which the potential of the node 81bu thereof is set at the L level, the n-channel MOS transistors 81bm, 81bp, 81br and 81bt receiving the potential of the node 81bu enter a non-conductive state. However, the n-channel MOS transistors 81bk, 81bn, 81bq and 81bs receive a signal output by the inverter 81be at the gates thereof through the n-channel MOS transistors 81bg, 81bh, 81bi and 81bj respectively, entering a conductive state. In this state, one of the four word lines 72a selected by the boosted row predecode signals BX0 to BX3 has its potential raised to the Vpp level. In any of the partial row decoders 81b in which the potential of the node 81bu thereof is sustained at the H level as it is, on the other hand, the n-channel MOS transistors 81bm, 81bp, 81br and 81bt receiving the potential of the node 81bu enter a conductive state. However, the n-channel MOS transistors 81bk, 81bn, 81bq and 81bs receive a signal output by the inverter 81be at the gates thereof through the n-channel MOS transistors 81bg, 81bh, 81bi and 81bj respectively, entering a non-conductive state. In this state, all the four word lines 72a are deselected, being put at the L level.

Figure 12:
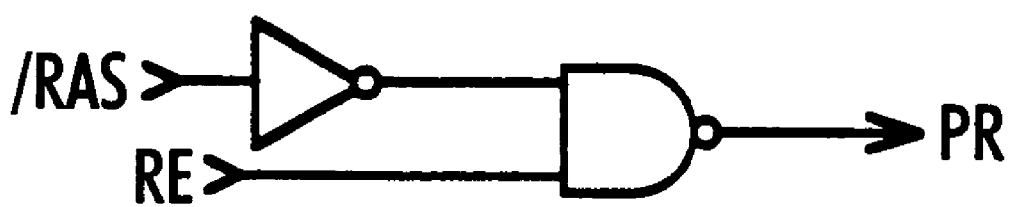
FIG. 12 depicts the circuit of the precharge-signal generating circuit of a dynamic random access memory in the first embodiment of the present invention.

The precharge-signal generating circuit 140 is shown in FIG. 12. As is shown in the figure, the precharge-signal generating circuit 140 comprises an inverter 140a and a NAND circuit 140b. When the row-address strobe signal /RAS is set at the H level to indicate a stand-by state, a precharge signal PR output by the precharge-signal generating circuit 140 is raised to the H level without regard to the row-address enable signal RE. When the row-address strobe signal /RAS is set at the L level to indicate an active state, on the other hand, the precharge signal PR is put at the L level if the row-address enable signal RE is at the H level or raised to the H level if the row-address enable signal RE is put at the L level. That is to say, as the row-address strobe signal /RAS is set at the L level, the precharge signal PR is put at the L level if the row-address enable signal RE is raised to the H level and, if the row-address enable signal RE is raised to the H level at predetermined time intervals in a self-refresh operation, the precharge signal PR is put at the L level.

FIG. 13 is a wiring diagram of the memory array 70 and the memory array peripheral circuit group 120. Each of the memory blocks 73 has 512 pairs of bit lines 72b which pairs each comprise bit lines 72ba and 72b. The sense-amplifier block 121 includes an amplify/precharge/equalize circuit 121a for amplifying a difference in potential between the bit lines 72ba and 72bb forming the pair of bit lines 72b, and precharging/equalizing potentials BLs and /BLs of the bit lines 72ba and 72bb respectively to a bit-line precharge potential VBL (=(Vcc+Vss)/2).

The memory-array peripheral circuit group 120 comprises an isolation gate circuit 122a, a pair of local I/O lines 122b, a local I/O gate circuit 122c, a pair of global I/O lines 122d and a global I/O gate circuit 122e. Comprising n-channel MOS transistors 122aa and 122ab, the isolation gate circuit 122a is used for isolating the bit line 72b from the amplify/precharge/equalize circuit 121a in response to a request made by a bit-line isolation signal BLIn. The pair of local I/O lines 122b comprises local I/O lines 122ba and 122bb. Comprising n-channel MOS transistors 122ca and 122cb, the local I/O gate circuit 122c is used for selectively connecting the pair of bit lines 72b to the pair of local I/O lines 122b in accordance with a column select signal CSLk. Comprising global I/O lines 122da and 122db, the pair of global I/O lines 122d is used as a couple of lines common to the sub-memory block 73. Comprising n-channel MOS transistors 122ea and 122eb, the global I/O gate circuit 122e is used for selectively connecting the pair of global I/O lines 122d to the pair of local I/O lines 122b in accordance with a select signal SELp.

Figure 14:
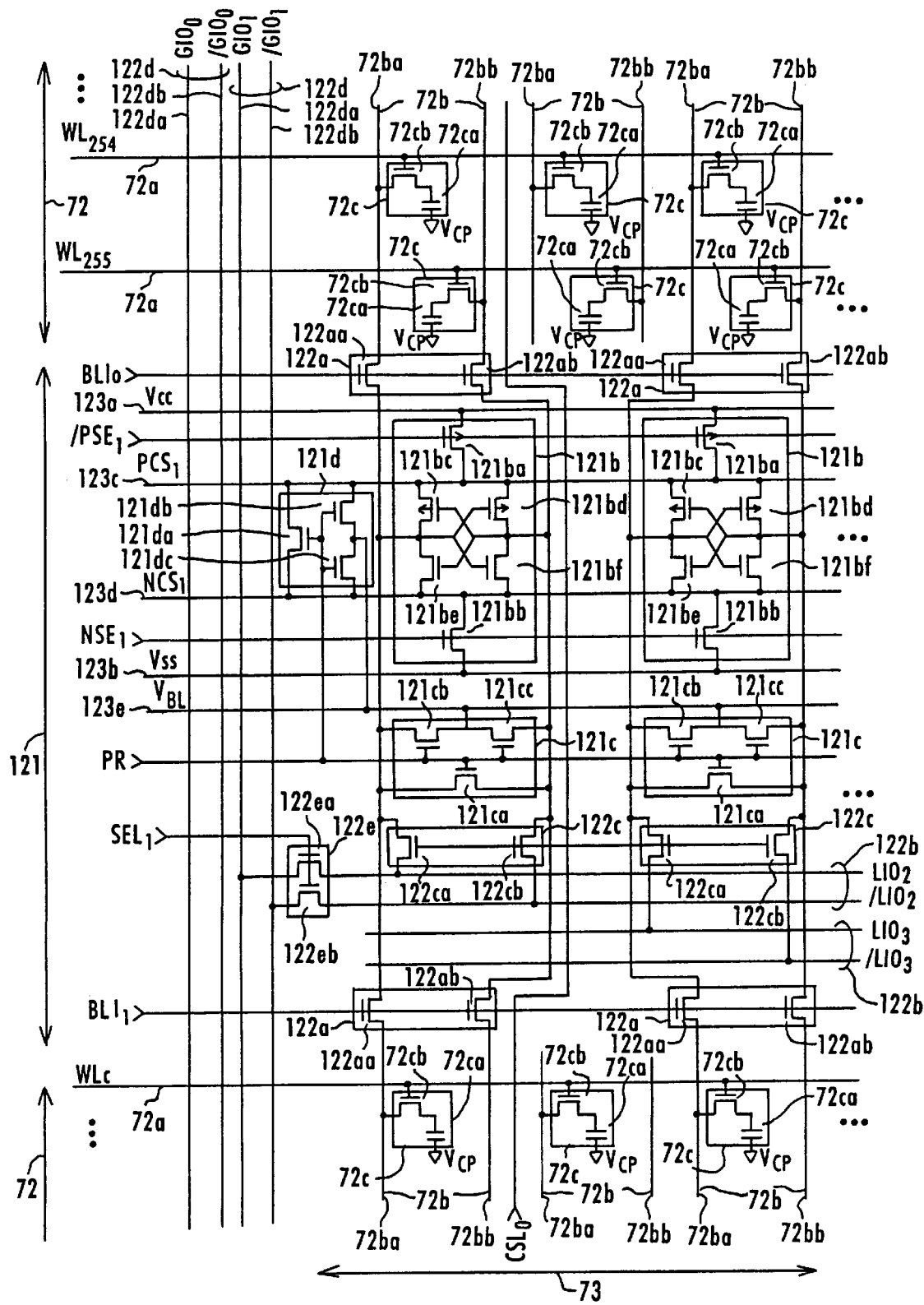
FIG. 14 depicts the sub memory block and the peripheral circuit of a dynamic random access memory in the first embodiment of the present invention.

The memory block 72 and part of the memory-array peripheral circuit group 120 are shown in more detail in FIG. 14. The memory blocks 72 are arranged in such a way that each of them corresponds to a cross point of a word line 72a and a pair of bit lines 72b. Each of the memory blocks 72 comprises a plurality of memory cells 72c each comprising a memory capacitor 72ca and a memory transistor 72cb. One of the electrodes of the memory capacitor 72ca is connected to a cell-plate potential Vcp. The memory transistor 72cb is connected between the other electrode of the memory capacitor 72ca and the bit line 72ba or 72bb. The gate of the memory transistor 72cb is connected to the word line 72a.

In addition, the memory-array peripheral circuit group 120 also includes a power-supply line 123a, to which the power-supply potential Vcc is supplied, a power-supply line 123b connected to the ground potential Vss, a common source line 123c, a common source line 123d and a precharge potential line 123e for delivering the bit-line precharge potential VBL. The memory array peripheral circuit group 120 further includes a sense amplifier 121b comprising a p-channel MOS transistor 121ba, an n-channel MOS transistor 121bb, p-channel MOS transistors 121bc and 121bd and n-channel MOS transistors 121bd and 121bf. The p-channel MOS transistor 121ba is used for precharging the common source line 123c to the power-supply potential Vcc when enabled by a sense-amplifier enable signal /PSEp. The p-channel MOS transistor 121bb is used for discharging the common source line 123d to the ground potential Vss when enabled by a sense-amplifier enable signal NSEp. Connected to each other to form a cross-coupled circuit, the p-channel MOS transistors 121bc and 121bd are used for rising the higher potential among those of the bit lines 72ba and 72bb to the power-supply potential Vcc. Similarly, connected to each other to form a cross-coupled circuit, the p-channel MOS transistors 121be and 121bf are used for lowering the lower potential among those of the bit lines 72ba and 72bb to the ground potential Vss. In this way, the sense amplifier 121b amplifies the difference in potential between the bit lines 72ba and 72bb forming the pair of bit lines 72b which are connected to the sense amplifier 121b through the isolation gate circuit 122a when enabled by the sense-amplifier enable signals /PSEp and NSEp so that the level of one of the bit lines 72baand 72bb is raised to the power-supply potential Vcc while the other of the bit lines 72ba and 72bb is lowered to the ground potential Vss.

Furthermore, the memory-array peripheral circuit group 120 also includes a bit-line precharging/equalizing circuit 121c and a common-source-line precharging/equalizing circuit 121d. The bit-line precharging/equalizing circuit 121c comprises an n-channel MOS transistor 121ca for equalizing the potentials of the bit lines 72ba and 72bb to each other when requested by the precharge signal PR, and N-channel MOS transistors 121cb and 121cc for precharging the potentials of the bit lines 72ba and 72bb to the bit-line precharge potential VBL when requested by the precharge signal PR. The common-source-line precharging/equalizing circuit 121d comprises an n-channel MOS transistor 121da for equalizing the potentials of the common-source lines 123c and 123d when requested by the precharge signal PR, and N-channel MOS transistors 121db and 121dc for precharging the potentials of the common-source lines 123c and 123d to the bit-line precharge potential VBL when requested by the precharge signal PR. The sense amplifier 121b, the bit-line precharging/equalizing circuit 121c and the common-source-line precharging/equalizing circuit 121d are included in the amplify/precharge/equalize circuit 121a.

Figure 15:
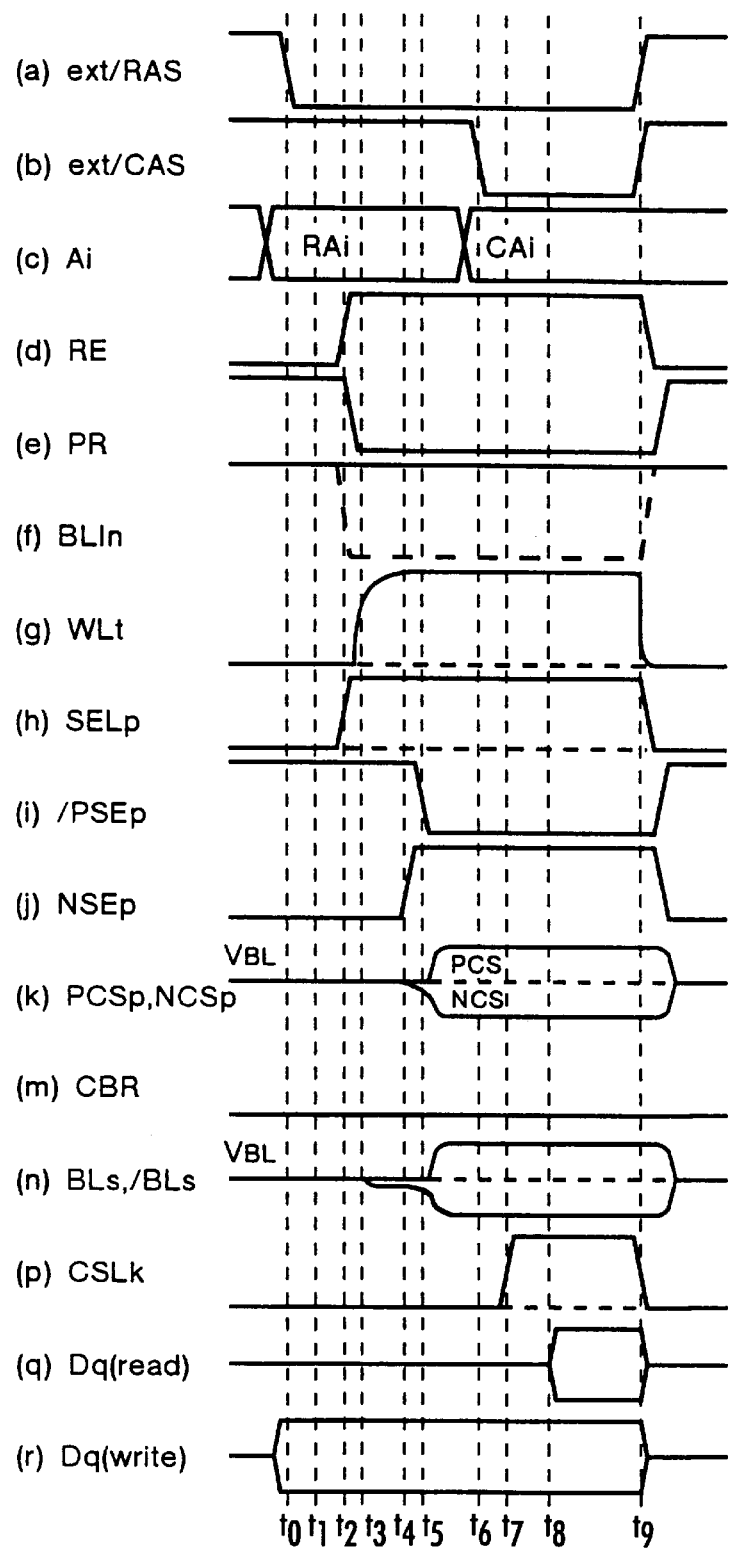
FIG. 15 depicts timing charts to illustrate the operations of a dynamic random access memory in the first embodiment of the present invention.

Referring to FIG. 15, read/write operations carried out on the DRAM 1 are explained. First, the row-address enable signal RE is set at the L level, FIG. 15(d), until the external row-address strobe signal ext/RAS is brought down from the H level to the L level at a time t0, FIG. 15(a). Accordingly, the potentials WLt of all the word lines 72a are set at the ground potential Vss, FIG. 15(g). As a result, the n-channel MOS transistor 72cb in the memory cell 72c enters a non-conductive state, allowing the memory cell 72c to remain at a state of holding data stored therein.

In addition, the bit-line isolating signal BLIn is raised to the increased potential Vpp, FIG. 15(f), putting all the pairs of bit lines 72b in a state of being connected to the associated sense amplifier 121b and the bit-line precharging/equalizing circuit 121c. Furthermore, the precharge signal PR is raised to the H level, FIG. 15(d). Receiving the precharge signal PR, the bit-line precharging/equalizing circuit 121c precharges and equalizes the potentials BLs and /BLs (where s=0, 1, , 511) of the bit lines 72ba and 72bb to the bit-line precharge potential VBL (=(½) (Vcc+Vss)), FIG. 15(n), whereas the common-source-line precharging/equalizing circuit 121d precharges and equalizes potentials PCSp and NCSp of the common-source-lines 123c and 123d to the precharge potential VBL, FIG. 15(k).

In addition, the sense-amplifier enable signals /PSEp and NSEp are put in the H and L levels, FIGS. 15(*i*) and 15(*j*), respectively. Accordingly, the p-channel MOS transistor 121*ba* and the n-channel MOS transistor 121*bb* employed in the sense amplifier 121*b* are put in a non-conductive state. As a result, the potential PCSp of the common source line 123*c* and the potential NCSp of the common source line 123*d* remain at the level of the bit-line precharge potential VBL, as shown in FIG. 15(*k*), causing all the sense amplifiers 121*b* to enter a non-active state.

Moreover, the column select signals CSLk are all put at the L level, FIG. 15(*p*). Therefore, the n-channel MOS transistors 122*ca* and 122*cb* employed in the local I/O gate circuit 122*c* receiving the column select signal CSLk both enter a non-conductive state, isolating the pair of bit lines 72*b* and the pair of local I/O lines 122*b* from each other. Likewise, the select signal SELp is also put at the L level as is shown in FIG. 15(*h*). Therefore, the n-channel MOS transistors 122*ea* and 122*eb* employed in the global I/O gate circuit 122*e* receiving the select signal SELp both enter a non-conductive state, isolating the pair of global I/O lines 122*d* and the pair of local I/O lines 122*b* from each other. At that time, the I/O buffer 160 is deactivated by the read/write control circuit 150. As a result, data Dq output by the I/O buffer 160 enters a high-impedance state, shown in FIG. 15(*q*).

As the external row-address strobe signal ext/RAS is brought down from the H level to the L level at a time t0 shown in FIG. 15(*a*), the row-address strobe signal output by the /RAS buffer 20 also changes to the L level. Since the CBR detecting signal CBR output by the refresh control circuit 40 remains at the L level, shown in FIG. 15(*m*), the row-address buffer 50 latches the address signals Ai and, as the row-address enable signal RE changes to the H level at a time t1, shown in FIG. 15(*d*), puts the row-address signals RAi and at levels of the same logic as the address signals Ai and the row-address signals /RAi at levels of the inverted logic of the address signals Ai.

The precharge-signal generating circuit 140 changes the precharge signal PR to the L level, FIG. 15(*e*). Receiving this precharge signal PR, the bit-line precharging/equalizing circuit 121*c* discontinues the operations to precharge and equalize the bit lines 72*a* and 72*b* whereas the common-source-line precharging/equalizing circuit 121*d* also discontinues the operations to precharge and equalize the common source lines 123*c* and 123*d* as well. In addition, the block-related-signal generating circuit 130 raises the bit-line isolating signal BLIn associated with the memory block 72 selected by the row-address strobe signals RAi and /RAi at a time t2 to the increased potential Vpp, shown in FIG. 15(*f*), and sustains the bit-line isolating signal BLIn at the increased potential Vpp as it is thereafter. As for the deselected memory block 72, the bit-line isolating signal BLIn is lowered to the L level. Receiving the bit-line isolating signal BLIn set at the L level, the isolation gate circuit 122*a* isolates the pair of bit lines 72*b* in the deselected memory block 72 from the sense amplifier 121*b* and the bit-line precharging/equalizing circuit 121*c*.

Furthermore, the block-related-signal generating circuit 130 raises the select signal SELp associated with the memory block 72 selected by the row-address signals RAi and /RAi to the H level, shown in FIG. 15(*h*), connecting the pair of local I/O lines 122*b* associated with the selected memory block 72 to the pair of global I/O lines 122*d* associated with the pair of local I/O lines 122*b* through the global I/O gate circuit 122*e*. Then, the potential WLt of the selected word line 72*a* in the memory block 72 selected by the row-address strobe signals RAi and /RAi, which are input to the DRAM 1 on the falling edge of the external row-address strobe signal ext/RAS, rises to the increased potential Vpp at a time t3 as is shown in FIG. 15(*g*). It should be noted that one memory block 72 is selected from each of the memory arrays 71 and one word line 72*a* is selected from each of the selected memory blocks 72.

Then, the n-channel MOS transistor 72*cb* employed in each of the 2,048 memory cells 72*c* connected to each of the selected word lines 72*a* enters a conductive state, allowing electric charge to be transferred between the other electrode of the capacitor 72*ca* and either the bit line 72*ba* or the bit line 72*bb*. The potential BLs or /BLs of the bit line 72*ba* or 72*bb* is increased or decreased to a level slightly higher or lower than the precharge potential VBL depending upon whether the data stored in the capacitor 72*ca* is represented by the H or L level, shown in FIG. 15(*n*). The figure depicts example wherein the data stored in the capacitor 72*ca* is represented by the L level.

As the sense-amplifier enable signal NSEp associated with the selected memory block 72 is raises to the H level at a time t4, shown in FIG. 15(*j*), the n-channel MOS transistor 121*bb* employed in the sense amplifier 121*b* that receives this sense-amplifier enable signal NSEp enters a conductive state, causing the potential NCSp of the common source line 123*d* to fall to the ground potential Vss, shown in FIG. 15(*k*). For this reason, an n-channel sense amplifier comprising the n-channel MOS transistors 121*be* and 121*bf* of the sense amplifier 121*b* lowers one of the potentials of the bit lines 72*ba* and 72*bb*, that is, either BLs or /BLs, which lowered potential is slightly lower than the other, to the ground potential Vss, shown in FIG. 15(*n*).

As the sense-amplifier enable signal /PSEp associated with the selected memory block 72 is raised to the L level at a time t5, shown in FIG. 15(*i*), the n-channel MOS transistor 121*ba* employed in the sense amplifier 121*b* that receives this sense-amplifier enable signal /PSEp enters a conductive state, causing the potential PCSp of the common source line 123*c* to rise to the power-supply potential Vcc, shown in FIG. 15(*k*). For this reason, a p-channel sense amplifier comprising the p-channel MOS transistors 121*bc* and 121*bd* of the sense amplifier 121*b* raises the higher one of the potentials of the bit lines 72*ba* and 72*bb*, that is, either BLs or /BLs, which increased potential is slightly higher than the other, to the power-supply potential Vcc, shown in FIG. 15(*n*).

In this way, a small difference in potential developed between the bit lines 72*ba* and 72*bb* forming the pair of bit lines 72*b* is amplified by the sense amplifier 121*b*. Later on, when the external column-address strobe signal ext/CAS is set to the L level at a time t6, shown in FIG. 15(*b*), the column-address strobe signal /CAS output by the /CAS buffer 30 also falls to the L level as well. Receiving this column-address strobe signal /CAS, the column-address buffer 90 latches the address signals Ai and sets the column-address signals CAi at levels of the same logic as the latched address signals Ai and the column-address signals /CAi at levels of the inverted logic of the latched address signals Ai. The column select signal CSLk selected by the column-address signals CAi and /CAi is set to the H level at a time t7, shown in FIG. 15(*p*). It should be noted that one column select signal CSLk is selected for each row of the sub-memory blocks 73. The pair of bit lines 72*b* associated with the column select signal CSLk, that is raised to the H level, is selected to be connected to the pair of local I/O lines 122*b* by the local I/O gate circuit 122*c*, allowing the difference in potential between the bit lines 72*ba* and 72*bb* forming the pair of bit lines 72b, which difference in potential has been amplified by the sense amplifier 121b, to be forwarded to the pair of global I/O lines 122d through the pair of local I/O lines 122b.

Furthermore, with the external write enable signal ext/WE raised to the H level while the external output enable signal ext/OE set to the L level, the input/output buffer 160 is activated into a read enable state by the read/write control circuit 150, allowing data to be output therefrom. As described above, data stored in memory cells 72c is transferred to the pair of global I/O lines 122d. The 4-bit data Dq corresponding to some of the transferred data selected by the data select signal DSm is output at a time t8, shown in FIG. 15(q). With the external write enable signal ext/WE lowered to the L level while the external output enable signal ext/OE raised to the H level, on the other hand, the input/output buffer 160 is activated into a write enable state by the read/write control circuit 150, allowing data to be input thereto. Four pairs of global I/O lines 122d selected from 64 pairs of global I/O lines 122d by the data select signal DSm are set at potentials representing the four input bits of the data Dq with each pair associated with one bit of the four bits as shown in FIG. 15(r). In this way, the data Dq is written into 4 memory cells 72c through the pairs of local I/O lines 122b connected to the pairs global I/O lines 122d and the pairs of bit lines 72b.

When the external row-address strobe signal ext/RAS is raised to the H level at a time t10, shown in FIG. 15(a), the row-address enable signal RE is set at the L level accordingly, FIG. 15(d). At the same time, the potential WLt of the word line 72a is set at the L level, shown in FIG. 15(g), the bit-line isolating signal BLIn is raised to the Vpp level, FIG. 15(f), the select signal SELp is lowered to the L level, shown in FIG. 15(h), the column select signal CSLk is put at the L level, shown in FIG. 15(p), the sense-amplifier enable signal /PSEp is raised to the H level, shown in FIG. 15(i) and the sense-amplifier enable signal NSEp is set at the L level, shown in FIG. 15(j).

In addition, the precharge signal PR is raised to the H level as shown in FIG. 15(e). Receiving this precharge signal PR, the bit-line precharging/equalizing circuit 121c precharges and equalizes the potentials BLs and /BLs of the pair of bit lines 72b to the bit-line precharge potential VBL, shown in FIG. 15(n). Likewise, receiving this precharge signal PR, the common-source-line precharging/equalizing circuit 121d precharges and equalizes the potentials PCSp and NCSp of the common source lines 123c and 123d to the bit-line precharge potential VBL, shown in FIG. 15(k).

Figure 16:
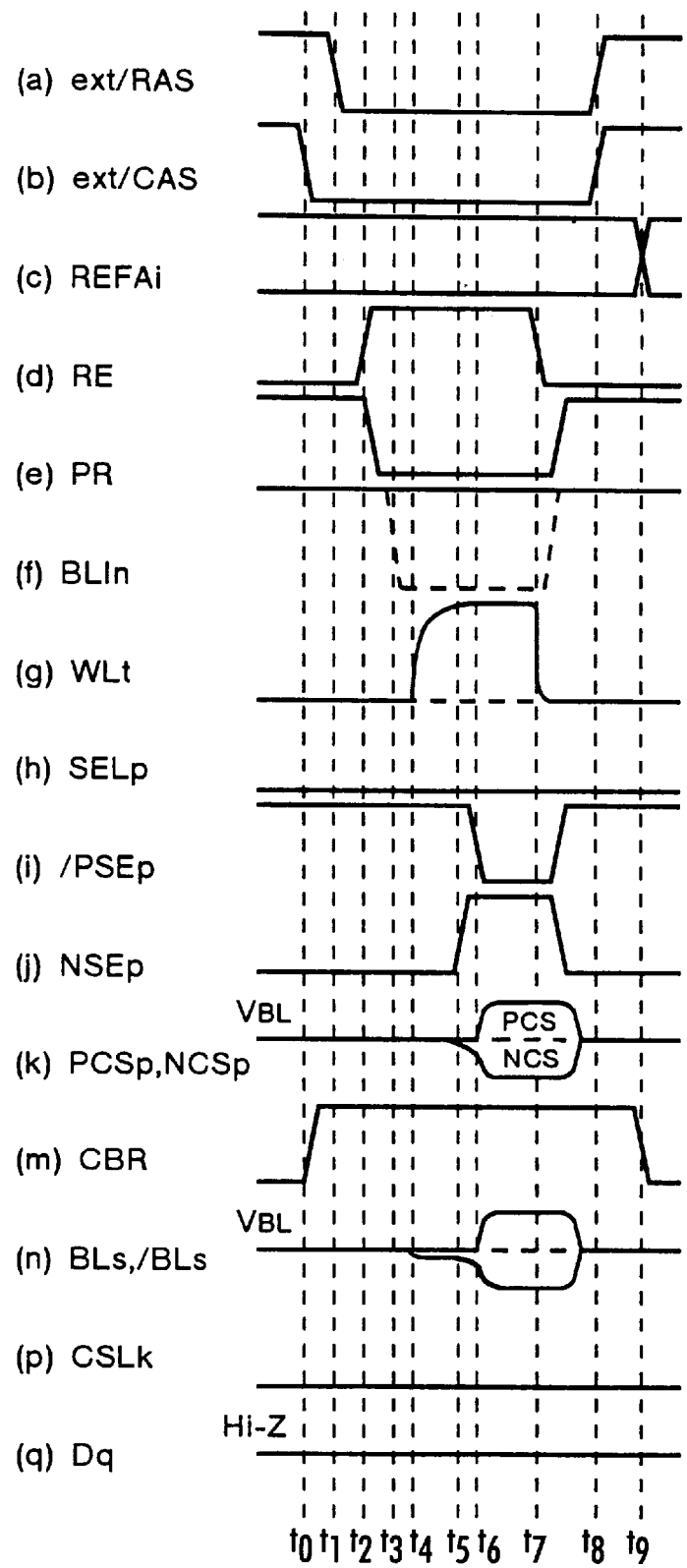
FIG. 16 depicts the timing charts to illustrate the operations of a dynamic random access memory in the first embodiment of the present invention.

The CBR-refresh operation of the DRAM 1 is explained by referring to FIG. 16. Before the external row-address strobe signal ext/RAS changes to the L level, the external column-address strobe signal ext/CAS changes to the L level at a time t0, shown in FIG. 16(b). As the external column-address strobe signal ext/CAS changes to the L level, the CBR detecting signal rises to the H level, shown in FIG. 16(m). At that time, the column-address buffer 90 does not latch the address signals Ai, setting all the column-address signals CAi and /CAi at the L level. This is because the external row-address strobe signal ext/RAS does not change to the L level before the external column-address strobe signal ext/CAS changes to the L level. As a result, the column select signal CSLk output by the column decoder 110 is kept at the L level, shown in FIG. 16(p). The block-related-signal generating circuit 130 keeps the select signal SELp at the L level upon receiving the CBR detecting signal which is raised at the H level, shown in FIG. 16(h). It should be noted that the select signal SELp is used for connecting the pair of local I/O lines 122b to the pair of global I/O lines 122d.

Later on, as the external row-address strobe signal ext/RAS changes to the L level at a time t1, shown in FIG. 16(a), the row-address enable signal RE changes to the H level at a time t2 accordingly, shown in FIG. 16(d), and the row-address buffer 50 sets the row-address signals RAi and /RAi at levels of the same logic as the refresh address signals REFAi generated by the refresh control circuit 40.

The precharge-signal generating circuit 140 sets the precharge signal PR at the L level, shown in FIG. 16(e). Receiving this precharge signal PR, the bit-line precharging/equalizing circuit 121c discontinues the operations to precharge and equalize the bit lines 72ba and 72bb and the common-source-line precharging/equalizing circuit 121d also discontinues the operations to precharge and equalize the common source lines 123c and 123d as well. In addition, the block-related-signal generating circuit 130 raises the bit-line isolating signal BLIn associated with the memory block 72 selected by the row-address strobe signals RAi and /RAi at a time t3 to the increased potential Vpp, shown in FIG. 16(f), and sustains the bit-line isolating signal BLIn at the increased potential Vpp as it is thereafter. As for the deselected memory block 72, the bit-line isolating signal BLIn is lowered to the L level. Receiving the bit-line isolating signal BLIn set at the L level, the isolation gate circuit 122a isolates the pair of bit lines 72b in the deselected memory block 72 from the sense amplifier 121b and the bit-line precharging/ equalizing circuit 121c.

The potential WLt of the selected word line 72a in the memory block 72 selected by the row-address strobe signals RAi and /RAi rises to the increased potential Vpp at a time t4, FIG. 16(g). In the case of the 8K refresh operation, one memory block 72 is selected from each of the sub-memory arrays 71 and, in the case of the 4K refresh operation, two memory blocks 72 are selected from each of the sub-memory arrays 71. One word line 72a is selected from each of the selected memory blocks 72.

The n-channel MOS transistor 72cb employed in each of the 2,048 memory cells 72c connected to each of the selected word lines 72a enters a conductive state, allowing electric charge to be transferred between the other electrode of the capacitor 72ca and either the bit line 72ba or the bit line 72bb. The potential BLs or /BLs of the bit line 72ba or 72bb is increased or decreased to a level slightly higher or lower than the precharge potential VBL depending upon whether the data stored in the capacitor 72ca is represented by the H or L level, shown in FIG. 16(n). The figure depicts an example wherein the data stored in the capacitor 72ca is represented by the L level.

As the sense-amplifier enable signal NSEp associated with the selected memory block 72 is raised to the H level at a time t5, shown in FIG. 16(j), the n-channel MOS transistor 121bb employed in the sense amplifier 121b that receives this sense-amplifier enable signal NSEp enters a conductive state, causing the potential NCSp of the common source line 123d to fall to the ground potential Vss, shown in FIG. 16(k). For this reason, the n-channel sense amplifier comprising the n-channel MOS transistors 121be and 121bf of the sense amplifier 121b lowers the lower one of the potentials of the bit lines 72ba and 72bb, that is, either BLs or /BLs, which lowered potential is slightly lower than the other, to the ground potential Vss, shown in FIG. 16(n).

Then, as the sense-amplifier enable signal /PSEp associated with the selected memory block 72 is lowered to the L level at a time t6, shown in FIG. 16(i), the n-channel MOS transistor 121*ba* employed in the sense amplifier 121*b* that receives this sense-amplifier enable signal /PSEp enters a conductive state, causing the potential PCSp of the common source line 123*c* to rise to the power-supply potential Vcc, shown in FIG. 16(*k*). For this reason, the p-channel sense amplifier comprising the p-channel MOS transistors 121*bc* and 121*bd* of the sense amplifier 121*b* raises the higher one of the potentials of the bit lines 72*ba* and 72*bb*, that is, either BLs or /BLs, which raised potential is slightly higher than the other, to the power-supply potential Vcc, shown in FIG. 16(*n*).

In this way, a small difference in potential developed between the bit lines 72*ba* and 72*bb* constituting the pair of bit lines 72*b* is amplified by the sense amplifier 121*b*, providing the power-supply potential Vcc or the ground potential Vss to the other electrode of the capacitor 72*ca* of the memory cell 72*c* depending upon whether data is stored in the capacitor 72*ca* as the H or L level. That is, the data stored in the capacitor 72*ca* as the H or L level is rewritten, executing a refresh operation on the memory cell 72*c*. Then, as the row-address enable signal RE changes to the L level at a time t7, shown in FIG. 16(*d*), the potentials of the word lines 72*a* all change to the L level, shown in FIG. 16(*g*), whereas the bit-line isolating signals BLIn all change to the Vpp level, shown in FIG. 16(*f*).

In addition, as the row-address enable signal RE changes to the L level, the sense-amplifier enable signal /PSEp is raised to the H level, shown in FIG. 16(*i*), while the sense-amplifier enable signal NSEp is lowered to the L level, shown in FIG. 16(*j*). Furthermore, the precharge signal PR is raised to the H level, FIG. 16(*e*). Receiving this precharge signal PR, the bit-line precharging/equalizing circuit 121*c* precharges and equalizes the potentials BLs and /BLs of the pair of bit lines 72*b* to the bit-line precharge potential VBL, shown in FIG. 16(*n*). Likewise, receiving this precharge signal PR, the common-source-line precharging/equalizing circuit 121*d* also precharges and equalizes the potentials PCSp and NCSp of the common source lines 123*c* and 123*d* to the bit-line precharge potential VBL, shown in FIG. 16(*k*).

Then, as the external row-address strobe signal ext/RAS 16(*a*) changes to the H level at a time t8, shown in FIG. 16(*a*), the CBR detecting signal falls to the L level at a time t9, shown in FIG. 16(*m*). The change in level of the CBR detecting signal, in turn, causes the value represented by the refresh-address signals REFAi to be incremented, shown in FIG. 16(*c*).

Figure 17:
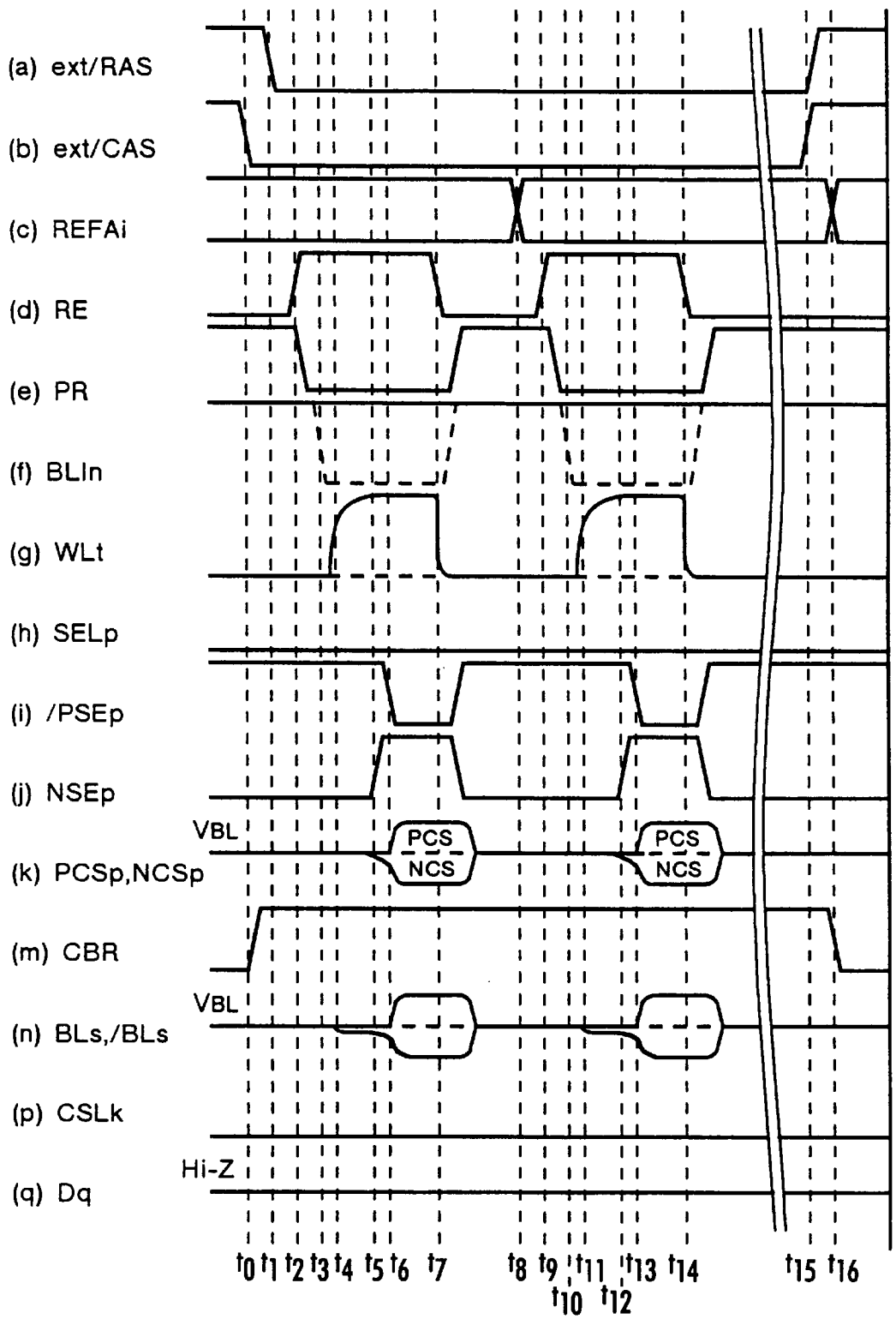
FIG. 17 depicts the timing charts to illustrate the operations of a dynamic random access memory in the first embodiment of the present invention.

A cell refresh operation of the DRAM 1 is explained by referring to FIG. 17. Instead of lowering the external row-address strobe signal ext/RAS to the L level, the row-address enable signal RE is lowered to the L level at a time t7, shown in FIG. 17(*d*), after the external column-address strobe signal ext/CAS falls to the L level at a time t0, shown in FIG. 17(*b*). Thereafter, the same operations as the CBR-refresh operations shown in FIG. 16 take place until the precharge signal PR rises to the H level, shown in FIG. 17(*e*). As this state is sustained until 100 microseconds lapse since the time t0, the self-refresh mode is established at a time t8, incrementing the value represented by the refresh-address signals REFAi, shown in FIG. 17(*c*). Then, the row-address enable signal RE is raised to the H level at a time t9, shown in FIG. 17(*d*), executing a refresh operation similar to the refresh operation carried out between the times t2 and t7. Thereafter, the same refresh operation is repeated automatically at fixed-time intervals.

Then, as the external row-address strobe signal ext/RAS is raised to the H level at a time t15, shown in FIG. 17(*a*), the CBR detecting signal CBR changes to the L level at a time t16, shown in FIG. 17(*m*). The change in level of the CBR detecting signal CBR, in turn, causes the value represented by the refresh-address signals REFAi to be incremented, shown in FIG. 17(*c*).

Figure 18:
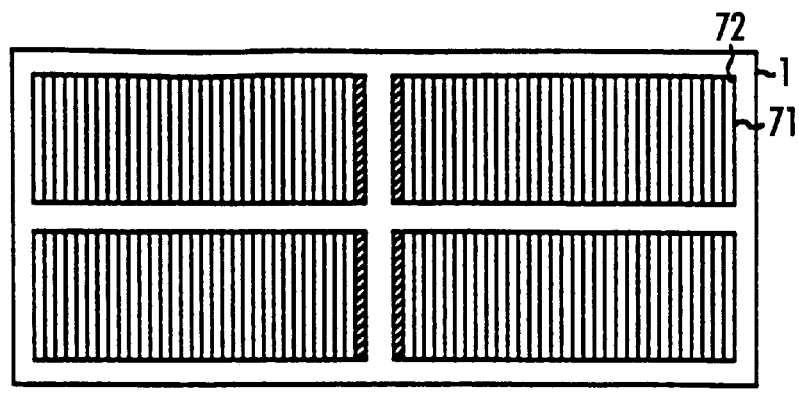
FIGS. 18(a)–18(d) depict an overview of a chip to show the memory block selection of a dynamic random access memory in the first embodiment of the present invention.
Figure 18:
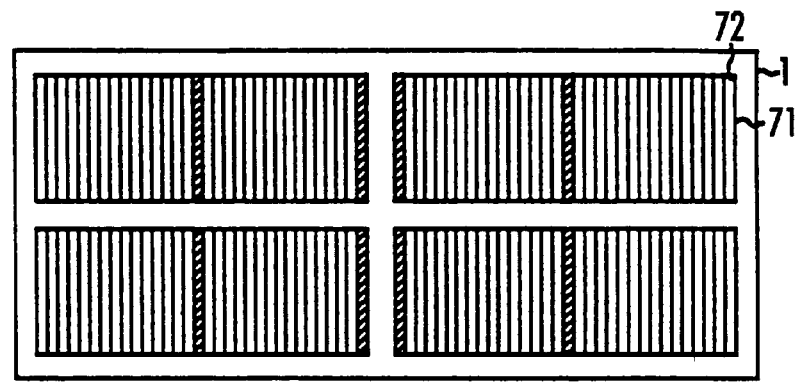
Figure 18:
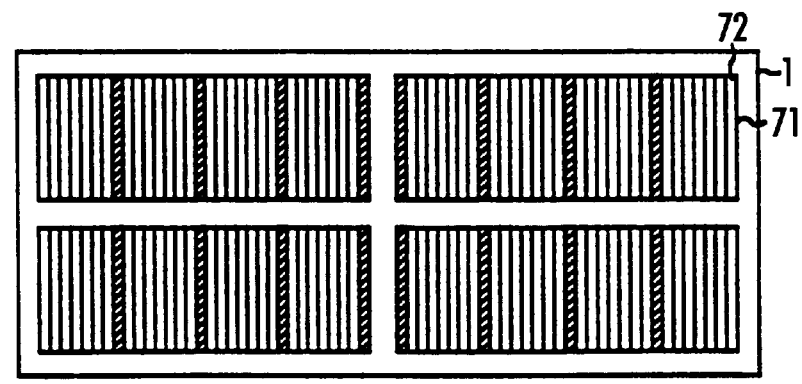
Figure 18:
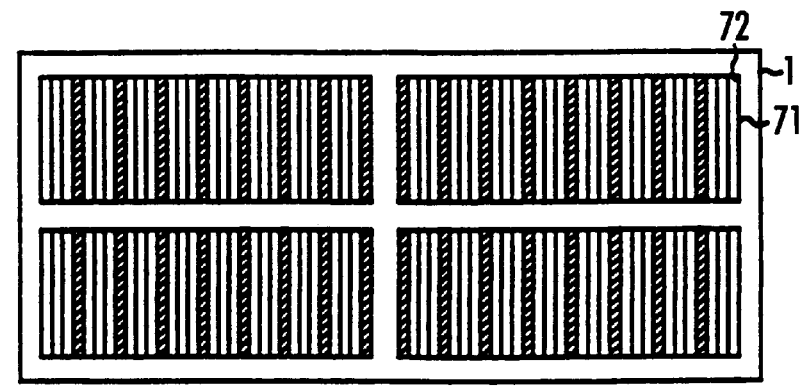

FIG. 18 depicts relations between the memory block selected by the row-address strobe signals RAi and /RAi and the refresh cycle. For example, even for row-address signals (RA0, RA1, . . . , RA12) set at (L, L, L, L, L, L, L, L, L, L, L, L, L) levels, in a normal read/write or 8K refresh operation, the hatched memory blocks 72 are selected from the sub-memory array 71, one memory block at a time, shown in FIG. 18(*a*). In a 4K refresh operation, the hatched memory blocks 72 are selected from the sub-memory array 71, two memory blocks at a time, shown in FIG. 18(*b*). In a 2K refresh operation, the hatched memory blocks 72 are selected from the sub-memory array 71, four memory blocks at a time, shown in FIG. 18(*c*). In a 1K refresh operation, the hatched memory blocks 72 are selected from the sub-memory array 71, eight memory blocks at a time, shown in FIG. 18(*d*).

The smaller the value of the refresh cycle, the greater the number of memory blocks 72 selected at one time and the greater the amount of power consumed instantaneously. Since the number of refresh operations carried out in the same refresh time of 128 msec decreases, however, the amount of power consumed during the 128-msec refresh time can not be said to increase. Rather, the number of operations performed by the circuits shared by a plurality of memory blocks 72 such as the row-address buffer 50 and the block-related-signal generating circuit 130 is reduced by the decrease in refresh-operation count, resulting in a reduced amount of power which is consumed during the 128-msec refresh time in order to refresh all the memory cells 72*c*.

On the contrary, the greater the value of the refresh cycle, the smaller the number of memory blocks 72 selected at one time and the smaller the amount of power consumed instantaneously. Since the number of refresh operations carried out in the same refresh time of 128 msec increases, however, the amount of power consumed during the 128-msec refresh time can hardly be said to decrease. Rather, the number of operations performed by the circuits shared by a plurality of memory blocks 72 such as the row-address buffer 50 and the block-related-signal generating circuit 130 is increased by the increase in refresh-operation count, resulting in a increased amount of power which is consumed during the 128-msec refresh time in order to refresh all the memory cells 72*c*.

As a result, for a user who wants to build a system wherein a margin exists in the instantaneous power consumption in the case of the self-refresh operation but the margin does not exist any more in the instantaneous power consumption in the case of the CBR-refresh operation, a DRAM with 8K CBR-refresh cycle and 1K self-refresh cycles is desirable.

By setting both the pads 43*aa* and 43*ab* of the self-refresh cycle program circuit 43*a* in an open state or bounding the pads 43*aa* and 43*ab* to a grounding pad, the 8K, 4K, 2K or 1K refresh option can be selected when the DRAM 1 is put in a package, allowing the 8K, 4K, 2K and 1K products to be fabricated by merely using the same masks and the same manufacturing line. As a result, the DRAM can be produced at a low cost.

In addition, the refresh cycle of the CBR-refresh operation of the DRAM 1 can be made different from the refresh cycle of the self-refresh operation, enhancing the degree of freedom to select products.

Second Embodiment

A second embodiment implementing a 64Mbit DRAM in accordance with the present invention is explained as follows. The difference between the DRAM implemented by the second embodiment and the DRAM implemented by the first embodiment is the configurations of the self-refresh cycle program circuit 43a and the CBR-refresh cycle program circuit 43b employed in the refresh cycle program circuit 43. In the case of the DRAM implemented by the first embodiment, a refresh-cycle option is selected by using a bonding pad while, in the case of the DRAM implemented by the second embodiment, a refresh-cycle option is selected by using a fuse. The other circuits employed in the DRAM implemented by the second embodiment are the same as those of the DRAM implemented by the first embodiment.

FIG. 19 depicts the self-refresh cycle program circuit 43a and the CBR-refresh cycle program circuit 43b employed in the refresh cycle program circuit 43 of the DRAM implemented by the second embodiment. As shown in the figure, the self-refresh cycle program circuit 43a comprises fuses 43au and 43av, inverters 43ac, 43ad, 43ae, 43af, 43ag and 43ah, p-channel MOS transistors 43ai and 43aj, n-channel MOS transistors 43aw, 43ax, 43az and 43al, an n-channel MOS transistor 43ay forming a half-latch circuit in conjunction with the inverter 43ac, an n-channel MOS transistor 43ao forming a half-latch circuit in conjunction with the inverter 43af, NAND circuits 43an, 43ap and 43aq and inverters 43ar, 43as and 43at.

If the fuses 43au and 43av are not blown up, for instance, by using a laser, thus, being kept as they are, the pull-up powers of the p-channel MOS transistors 43ai and 43aj are greater than the pull-down powers of the n-channel MOS transistors 43ax and 43al, raising inputs to the inverters 43ac and 43af all but to the power-supply potential Vcc. As a result, the self-refresh-cycle requesting signals SRF1K, SRF2K and SRF4K are all set at the L level. If the fuse 43au is blown up by a laser while the fuse 43av is not and kept as it is, the input to the inverter 43ac is set at the ground potential Vss by the n-channel MOS transistor 43ax, programming the self-refresh-cycle requesting signal SRF4K at the H level. If the fuse 43av is blown up by a laser while the fuse 43au is not and kept as it is, the input to the inverter 43af is set at the ground potential Vss by the n-channel MOS transistor 43al, programming the self-refresh-cycle requesting signal SRF2K at the H level. If the fuses 43au and 43av are blown up by a laser, the self-refresh-cycle requesting signal SRF1K is programmed at the H level.

The CBR-refresh cycle program circuit 43b comprises a fuse 43bg, inverters 43bb, 43bc and 43bd, a p-channel MOS transistor 43be, n-channel MOS transistors 43bh and 43bi and an n-channel MOS transistor 43bj forming a half-latch circuit in conjunction with the inverter 43bb. If the fuse 43bg is not blown up by a laser and kept as it is, the self-refresh-cycle requesting signal CBR4K is set at the L level. If the fuse 43bg is blown up by a laser, on the other hand, the self-refresh-cycle requesting signal CBR4K is programmed at the H level.

According to one aspect of the present invention, a semiconductor device is obtained which provides an easy selection of a refresh cycle of the self-refresh operation.

Further, according to another aspect of the present invention, a semiconductor device is obtained which provides an optimum refresh cycle in accordance with refresh mode.

Numerous additional modifications and variations of the present invention are possible in light of the above teachings. It is therefore to be understood that within the scope of the appended claims, the present invention may be practiced otherwise than as specifically described herein.

What is claimed:

1. A semiconductor memory device comprising:
   a plurality of memory blocks each including a plurality of memory cells arranged in a matrix of a plurality of rows and a plurality of columns, a plurality of word lines each associated with one of said plurality of rows and a plurality of pairs of bit lines each associated with one of said plurality of columns;
   a plurality of sense amplifiers connected to said plurality of pairs of bit lines;
   a refresh-cycle program circuit for programming refresh cycles;
   an address generating circuit for generating refresh address signals for use in refresh operations;
   a self-refresh control circuit for incrementing a value represented by said refresh address signals at prescribed time intervals in a self-refresh mode; and
   select means for selecting at least one of said plurality of memory blocks in accordance with one of said refresh cycles programmed by said refresh-cycle program circuit, selecting one of said plurality of word lines of the selected memory block and activating some of said plurality of sense amplifiers associated with said selected memory block.

2. The semiconductor memory device according to claim 1, wherein said select means comprises:
   a block decoder for outputting block select signals for selecting at least one of said plurality of memory blocks in accordance with some of said refresh address signals for selecting blocks and said refresh cycle programmed by said refresh-cycle program circuit; and
   a plurality of row decoder blocks each associated with one of said plurality of memory blocks wherein each of said plurality of row decoder blocks is put in a select state by said block select signal assigned thereto and, in said select state, selects one of said plurality of word lines in the memory block associated with the corresponding row decoder block in accordance with some of said refresh address signals for selecting said one of said plurality of word lines.

3. The semiconductor memory device according to claim 2, wherein said select means comprises a sense-amplifier enable signal generating circuit for activating said some of said plurality of sense amplifiers associated with at least one memory block selected in accordance with some of said refresh address signals for selecting blocks and said refresh cycle programmed by said refresh-cycle program circuit.

4. The semiconductor memory device according to claim 1, wherein
   a number of memory blocks selected by said select means in said self-refresh mode is dependent on said refresh-cycle programmed by said refresh-cycle program circuit.

5. The semiconductor memory device according to claim 1, wherein
   said semiconductor memory device has a CBR-refresh mode, operative in response to external signals received in an order of column address strobe before row address strobe, and
   said refresh-cycle programmed by said refresh-cycle program circuit is capable of differing from a refresh-cycle of said CBR-refresh mode.

6. The semiconductor memory device according to claim 1, wherein said semiconductor memory device has a CBR-refresh mode, operative in response to external signals received in an order of column address strobe before row address strobe, said select means selects a predetermined number of memory blocks in said CBR-refresh mode, and a number of memory blocks selected by said select means in said self-refresh mode is capable of differing from said predetermined number.

7. The semiconductor memory device according to claim 1, wherein said refresh-cycle program circuit includes a plurality of fuses capable of being blown out for programming one of said refresh cycles.

8. A semiconductor memory device comprising:

a plurality of memory blocks each including a plurality of memory cells arranged in a matrix of a plurality of rows and a plurality of columns, a plurality of word lines each associated with one of said plurality of rows and a plurality of pairs of bit lines each associated with one of said plurality of columns;

a plurality of sense amplifiers connected to said plurality of pairs of bit lines;

a first refresh-cycle program circuit for programming first refresh cycles in first refresh mode;

a second refresh-cycle program circuit for programming second refresh cycles in second refresh mode;

an address generating circuit for generating refresh address signals for use in refresh operations; and select means for selecting a first number of said memory blocks in accordance with one of said first refresh cycles programmed by said first refresh-cycle program circuit in said first refresh mode, selecting a second number memory blocks in accordance with one of said second refresh cycles programmed by said second refresh-cycle program circuit in said second refresh mode, selecting some of said plurality of word lines of the selected memory blocks and activating one of said plurality of sense amplifiers associated with the selected memory blocks.

9. The semiconductor memory device according to claim 8, wherein said first refresh mode is a self-refresh mode, and said second refresh mode is a CBR-refresh mode, operative in response to external signals received in an order of column address strobe before row address strobe.

10. The semiconductor memory device according to claim 8, wherein the first number is responsive to one of said first refresh cycles programmed by said first refresh-cycle program circuit, and the second number is responsive to one of said second refresh cycles programmed by said second refresh-cycle program circuit.

11. The semiconductor memory device according to claim 8, wherein one of said first refresh cycles programmed by said first refresh-cycle program circuit is different from one of said second refresh cycles programmed by said second refresh-cycle program circuit.

12. The semiconductor memory device according to claim 8, wherein the first number is different from the second number.

13. The semiconductor memory device according to claim 8, wherein said first refresh-cycle program circuit includes a plurality of fuses capable of being blown out for programming one of said first refresh cycles.

14. The semiconductor memory device according to claim 8, wherein said second refresh-cycle program circuit includes a fuse capable of being blown out for programming one of said second refresh cycles.

15. A semiconductor memory device comprising:

a plurality of memory blocks each including a plurality of memory cells arranged in a matrix of a plurality of rows and a plurality of columns, a plurality of word lines each associated with one of said plurality of rows and a plurality of pairs of bit lines each associated with one of said plurality of columns;

a plurality of sense amplifiers connected to said plurality of pairs of bit lines;

a refresh-cycle program circuit for programming refresh cycles;

an address generating circuit for generating refresh address signals for use in refresh operations;

a self-refresh control circuit for incrementing a value represented by said refresh address signals at predetermined time intervals in self-refresh mode; and select means for selecting at least one of said plurality of memory blocks in accordance with one of said refresh cycles programmed by said refresh-cycle program circuit, selecting one of said plurality of word lines of each of the at least one selected memory block and activating some of said plurality of sense amplifiers associated with at least one selected memory block.

* * * * *